United States Patent
Yoshimizu et al.

(10) Patent No.: US 9,997,533 B2
(45) Date of Patent: Jun. 12, 2018

(54) SEMICONDUCTOR DEVICE AND METHOD FOR MANUFACTURING SAME

(71) Applicant: Toshiba Memory Corporation, Tokyo (JP)

(72) Inventors: Yasuhito Yoshimizu, Mie (JP); Satoshi Wakatsuki, Mie (JP); Yohei Sato, Mie (JP); Keiichi Sawa, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/071,006

(22) Filed: Mar. 15, 2016

(65) Prior Publication Data
US 2017/0098659 A1    Apr. 6, 2017

Related U.S. Application Data

(60) Provisional application No. 62/237,723, filed on Oct. 6, 2015.

(51) Int. Cl.
| | |
|---|---|
| *H01L 21/28* | (2006.01) |
| *H01L 27/11582* | (2017.01) |
| *H01L 21/02* | (2006.01) |
| *H01L 21/311* | (2006.01) |
| *H01L 21/764* | (2006.01) |

(52) U.S. Cl.
CPC .... *H01L 27/11582* (2013.01); *H01L 21/0217* (2013.01); *H01L 21/02164* (2013.01); *H01L 21/28282* (2013.01); *H01L 21/31111* (2013.01); *H01L 21/764* (2013.01)

(58) Field of Classification Search
CPC ......... H01L 21/28282; H01L 21/76877; H01L 21/28273; H01L 21/76816; H01L 21/7682; H01L 21/764
USPC .......................... 257/314, 43, 324, 319, 315
See application file for complete search history.

(56) References Cited

U.S. PATENT DOCUMENTS

| | | | |
|---|---|---|---|
| 8,569,825 | B2 | 10/2013 | Iinuma |
| 8,952,439 | B2 | 2/2015 | Suzuki |
| 2009/0242967 | A1 | 10/2009 | Katsumata et al. |
| 2013/0214342 | A1 | 8/2013 | Sato |

(Continued)

FOREIGN PATENT DOCUMENTS

| | | |
|---|---|---|
| JP | 5-34708 | 2/1993 |
| JP | 9-36324 | 2/1997 |

(Continued)

*Primary Examiner* — Brett Feeney
*Assistant Examiner* — Rodolfo D Fortich
(74) *Attorney, Agent, or Firm* — Finnegan, Henderson, Farabow, Garrett & Dunner, L.L.P.

(57) ABSTRACT

According to one embodiment, the plurality of charge storage films are separated in a stacking direction with a second air gap interposed. The plurality of insulating films are provided on side surfaces of electrode layers opposing the charge storage films, on portions of surfaces of the electrode layers continuous from the side surfaces and opposing a first air gap between the electrode layers, and on corners of the electrode layers between the portions and the side surfaces. The plurality of insulating films are divided in the stacking direction with a third air gap interposed and without the charge storage films being interposed. The third air gap communicates with the first air gap and the second air gap between the first air gap and the second air gap.

6 Claims, 38 Drawing Sheets

(56) References Cited

U.S. PATENT DOCUMENTS

| | | |
|---|---|---|
| 2013/0248969 A1 | 9/2013 | Suzuki |
| 2013/0248970 A1 | 9/2013 | Kai et al. |
| 2015/0221738 A1* | 8/2015 | Ahn .................. G11C 13/0002 365/185.29 |

FOREIGN PATENT DOCUMENTS

| | | |
|---|---|---|
| JP | 9-129720 | 5/1997 |
| JP | 9-148539 | 6/1997 |
| JP | 2013-201264 | 10/2013 |

* cited by examiner

US 9,997,533 B2

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/237,723, filed on Oct. 6, 2015; the entire contents of which are incorporated herein by reference.

FIELD

Embodiments described herein relate generally to a semiconductor device and a method for manufacturing the same.

BACKGROUND

For example, a method for manufacturing a three-dimensional semiconductor memory device includes processes of forming a stacked body including a plurality of electrode layers on a substrate, making a hole in the stacked body to extend in the stacking direction, and forming a film on a side surface of the hole. The film that is formed on the side surface of the hole is continuous in the stacking direction; and it is difficult to divide such a film in the stacking direction by anisotropic etching through the hole.

DETAILED DESCRIPTION

Figure 1A:
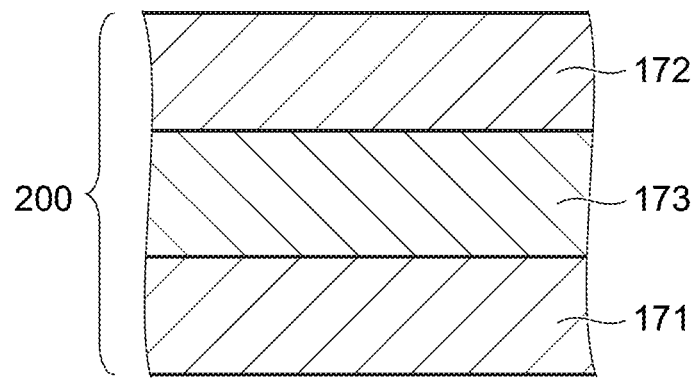
FIGS. 1A to 8 are schematic cross-sectional views showing a method for manufacturing a semiconductor device of a first embodiment.

According to one embodiment, a semiconductor device includes a substrate, a stacked body, a semiconductor film, a plurality of charge storage films, and a plurality of insulating films. The stacked body is provided above the substrate. The stacked body includes a plurality of electrode layers stacked with a first air gap interposed. The semiconductor film extends in a stacking direction through the stacked body. The plurality of charge storage films are provided between the semiconductor film and the electrode layers. The plurality of charge storage films are separated in the stacking direction with a second air gap interposed. The plurality of insulating films are provided on side surfaces of the electrode layers opposing the charge storage films, on portions of surfaces of the electrode layers continuous from the side surfaces and opposing the first air gap, and on corners of the electrode layers between the portions and the side surfaces. The plurality of insulating films are divided in the stacking direction with a third air gap interposed and without the charge storage films being interposed. The third air gap communicates with the first air gap and the second air gap between the first air gap and the second air gap.

Embodiments will now be described with reference to the drawings. The same components are marked with the same reference numerals in the drawings.

First, a method for manufacturing a semiconductor device of a first embodiment will be described with reference to FIG. 1A to FIG. 9C.

FIG. 1A to FIG. 8 are schematic cross-sectional views showing the method for manufacturing the semiconductor device of the first embodiment.

Figure 9A:
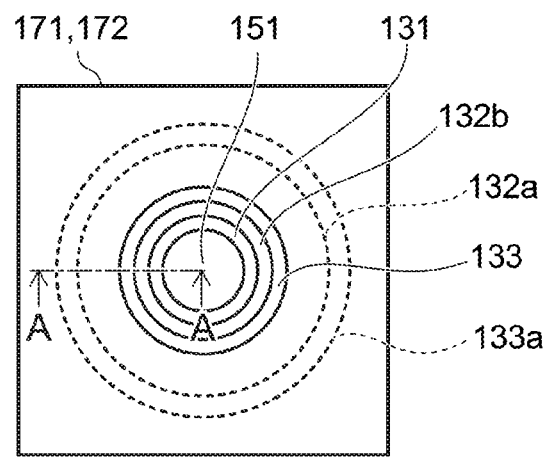
FIGS. 9A to 9C are schematic plan views showing a method for manufacturing the semiconductor device of the first embodiment.
Figure 9B:
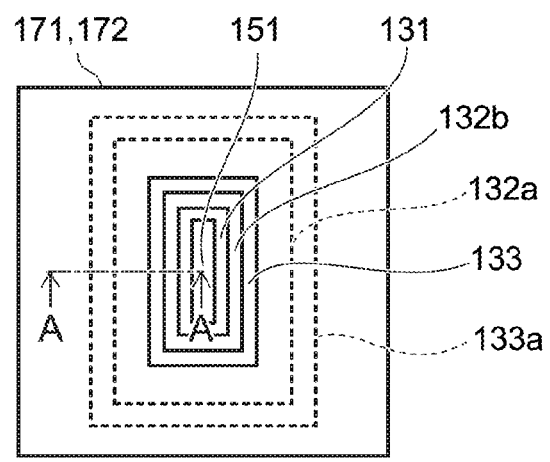
Figure 9C:
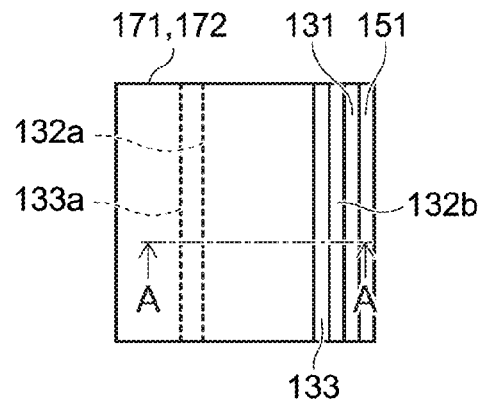

FIG. 9A to FIG. 9C are schematic plan views showing the method for manufacturing the semiconductor device of the first embodiment.

The method for manufacturing the semiconductor device of the first embodiment includes a process of working a stacked body 200 shown in FIG. 1A. The stacked body 200 includes a first layer 171, a second layer 172, and a sacrificial layer 173 provided between the first layer 171 and the second layer 172.

For example, the first layer 171 is formed on a not-shown substrate or other layer. The sacrificial layer 173 is formed on the first layer 171; and the second layer 172 is formed on the sacrificial layer 173. The sacrificial layer 173 is interposed between the first layer 171 and the second layer 172.

The sacrificial layer 173 is a layer of a different type of material from the first layer 171 and the second layer 172; and the etching selectivity of the sacrificial layer 173 with respect to the first layer 171 and the second layer 172 is sufficiently high. The first layer 171 and the second layer 172 may be of the same type of material or of different types of materials.

Figure 1B:
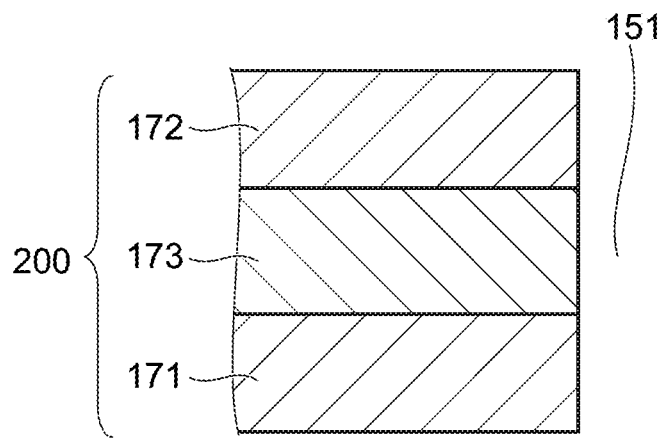

A first through-portion 151 is made in the stacked body 200 as shown in FIG. 1B. The first through-portion 151 is, for example, a hole or a slit made by anisotropic etching such as reactive ion etching (RIE). The first through-portion 151 pierces the second layer 172, the sacrificial layer 173 and the first layer 171, and extends in the stacking direction of the second layer 172, the sacrificial layer 173 and the first layer 171.

The surface of the first layer 171 along the first through-portion 151, the surface of the second layer 172 along the first through-portion 151, and the surface of the sacrificial layer 173 along the first through-portion 151 are exposed in the first through-portion 151.

Then, the sacrificial layer 173 is etched using an etchant or an etching gas supplied to the first through-portion 151. For example, the sacrificial layer 173 which is a silicon oxide film is etched by supplying an etchant containing hydrofluoric acid to the first through-portion 151. The first layer 171 and the second layer 172 are, for example, metal films that have etching resistance to the etchant containing hydrofluoric acid.

Figure 1C:
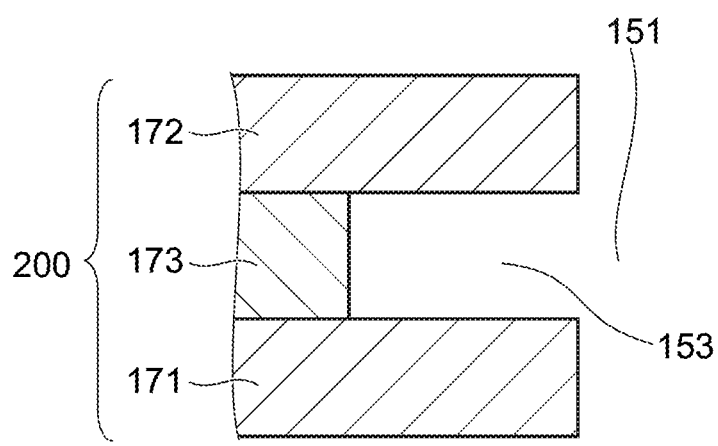

The etching of the sacrificial layer 173 progresses from the end surface of the sacrificial layer 173 exposed in the first through-portion 151; and the end surface of the sacrificial layer 173 recedes in the diametral direction or width direction of the first through-portion 151 to be separated from the first through-portion 151 as shown in FIG. 1C.

By the etching of the sacrificial layer 173, an air gap 153 that communicates with the first through-portion 151 is made between the first layer 171 and the second layer 172. One portion of the sacrificial layer 173 remains between the first layer 171 and the second layer 172. The air gap 153 is made between the first through-portion 151 and the remaining one portion of the sacrificial layer 173.

Figure 2A:
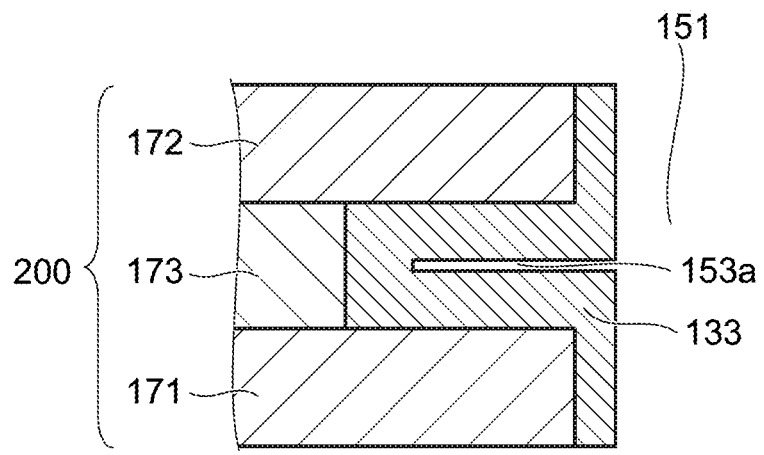

Then, a first film 133 shown in FIG. 2A is formed in the air gap 153 by chemical vapor deposition (CVD) or atomic layer deposition (ALD). The source gas in the film formation is supplied to the air gap 153 through the first through-portion 151. The first film 133 is formed also on the side surface of the second layer 172 adjacent to the first through-portion 151 and the side surface of the first layer 171 adjacent to the first through-portion 151.

The first film 133 is formed conformally along the side surface of the second layer 172, the lower surface of the second layer 172 adjacent to the air gap 153 (the surface opposing the first layer 171), the side surface of the sacrificial layer 173 adjacent to the air gap 153, the upper surface of the first layer 171 adjacent to the air gap 153 (the surface opposing the second layer 172), and the side surface of the first layer 171.

The film thickness of the first film 133 is thinner than ½ of the height (the length in the stacking direction) of the air gap 153. Therefore, one portion 153a of the air gap 153 remains between the first film 133 formed on the lower surface of the second layer 172 and the first film 133 formed on the upper surface of the first layer 171.

The remaining air gap 153a communicates with the first through-portion 151 and extends from the first through-portion 151 toward the sacrificial layer 173.

The first film 133 is a film of a different type of material from the first layer 171 and the second layer 172; and the etching selectivity of the first film 133 with respect to the first layer 171 and the second layer 172 is sufficiently high.

Figure 2B:
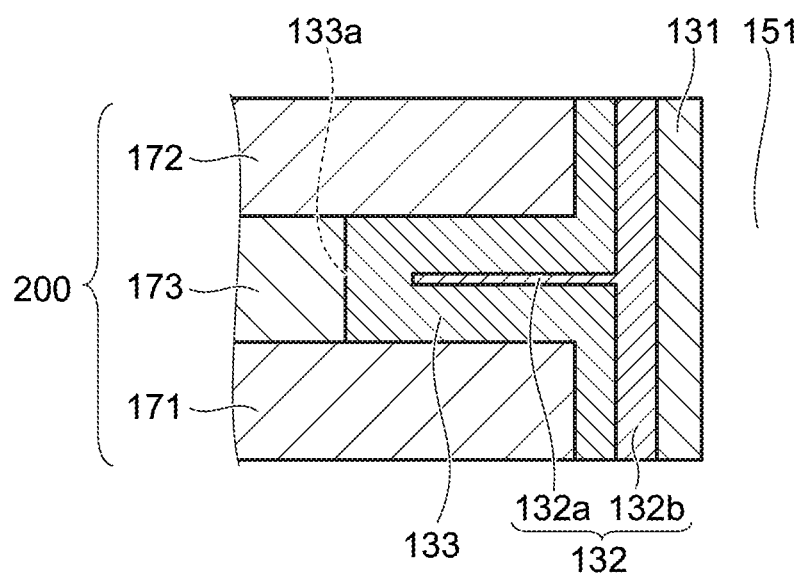

Then, a second film 132 shown in FIG. 2B is formed in the air gap 153a and on the side surface of the first film 133 adjacent to the first through-portion 151. The second film 132 includes a first portion 132a filled into the air gap 153a, and a second portion 132b provided on the side surface of the first film 133 and extending in the stacking direction of the stacked body 200.

The first portion 132a is provided as one body with the second portion 132b and extends from the second portion 132b toward the sacrificial layer 173. The first portion 132a is provided between the first film 133 formed on the lower surface of the second layer 172 and the first film 133 formed on the upper surface of the first layer 171.

The second film 132 is a film of a different type of material from the first layer 171, the second layer 172, and the first film 133; and the etching selectivity of the second film 132 with respect to the first layer 171, the second layer 172, and the first film 133 is sufficiently high.

A third film 131 is formed on the side surface of the second portion 132b of the second film 132 adjacent to the first through-portion 151. The third film 131 extends continuously in the stacking direction of the stacked body 200. The third film 131 is a film of a different type of material from the second film 132; and the etching selectivity of the second film 132 with respect to the third film 131 is sufficiently high.

The first through-portion 151 may be filled with the first film 133, the second film 132, and the third film 131; or one portion of the first through-portion 151 may remain at the side of the third film 131 as a cavity. Or, another film may be formed on the side surface of the third film 131.

Figure 3A:
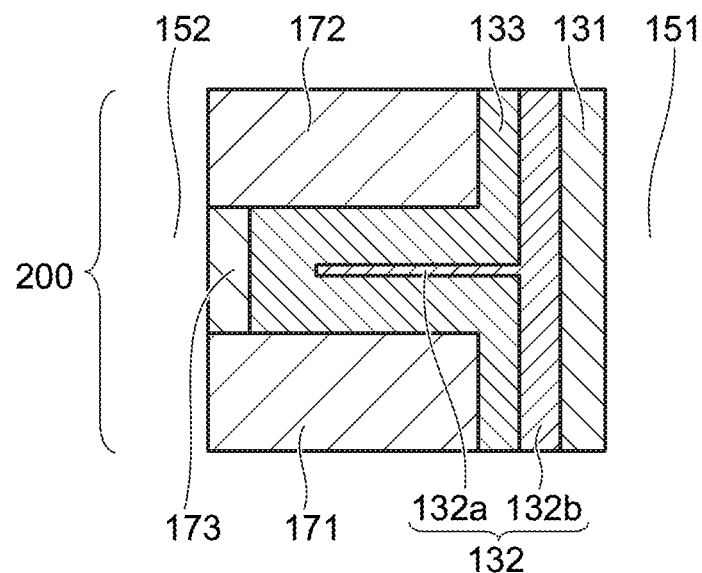

Then, as shown in FIG. 3A, a second through-portion 152 is made in the region of the stacked body 200 where the sacrificial layer 173 remains. The second through-portion 152 is, for example, a hole or a slit made by anisotropic etching such as RIE. The second through-portion 152 pierces the second layer 172, the sacrificial layer 173 and the first layer 171, and extends in the stacking direction of the second layer 172, the sacrificial layer 173 and the first layer 171.

The surface of the first layer 171 along the second through-portion 152, the surface of the second layer 172 along the second through-portion 152, and the surface of the sacrificial layer 173 along the second through-portion 152 are exposed in the second through-portion 152.

Then, the sacrificial layer 173 that remains between the first layer 171 and the second layer 172 is etched using an etchant or an etching gas supplied to the second through-portion 152. For example, the sacrificial layer 173 which is a silicon oxide film is etched by supplying an etchant containing hydrofluoric acid to the second through-portion 152.

Figure 3B:
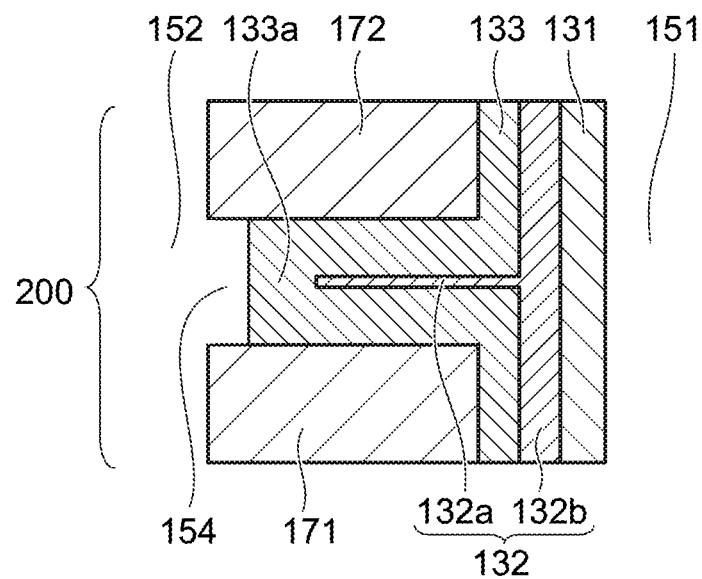

By the etching of the sacrificial layer 173, an air gap 154 that communicates with the second through-portion 152 is made between the first layer 171 and the second layer 172 as shown in FIG. 3B. An end portion 133a of the first film 133 is exposed in the air gap 154.

Or, the first film 133 can be exposed at the side surface of the second through-portion 152 by making the second through-portion 152 so that the second through-portion 152 and the end portion 133a of the first film 133 overlap.

Figure 4A:
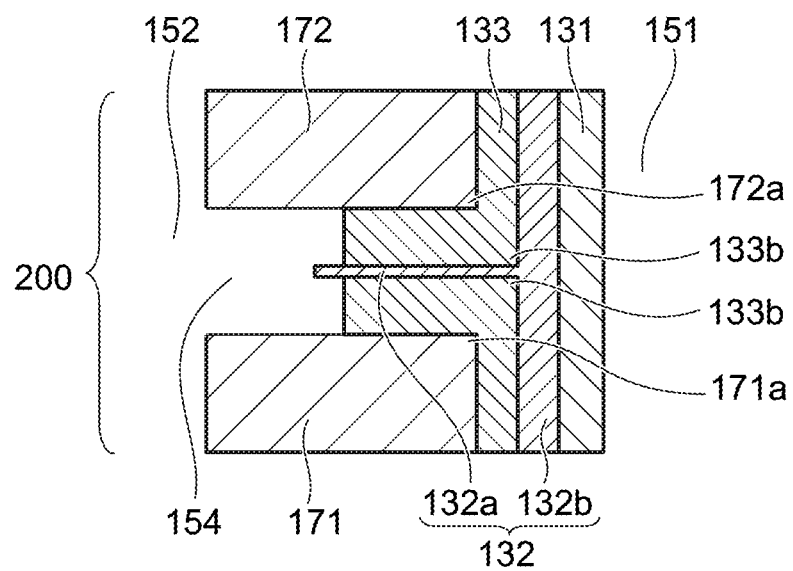

Then, the end portion 133a of the first film 133 that is directly exposed in the second through-portion 152 or exposed in the second through-portion 152 via the air gap 154 is etched. The etching of the first film 133 is caused to progress from the end portion 133a; and the first portion 132a of the second film 132 is exposed as shown in FIG. 4A.

For example, the first film 133 which is a silicon oxide film is etched by supplying an etchant containing hydrofluoric acid to the second through-portion 152. For example, the second film 132 which is a silicon nitride film has etching resistance to the etchant containing hydrofluoric acid.

The first layer 171 includes a corner 171a between the side surface on the first through-portion 151 side and the surface opposing the second layer 172. The side surface of the first layer 171 is continuous from the surface opposing the second layer 172 with the corner 171a interposed. The second layer 172 includes a corner 172a between the side surface on the first through-portion 151 side and the surface opposing the first layer 171. The side surface of the second layer 172 is continuous from the surface opposing the first layer 171 with the corner 172a interposed.

The first film 133 includes a corner 133b that covers the corner 171a formed along the corner 171a of the first layer 171, and a corner 133b that covers the corner 172a formed along the corner 172a of the second layer 172. The base on the second portion 132b side of the first portion 132a of the second film 132 is interposed between the corners 133b in the stacking direction of the stacked body 200. The first portion 132a and the second portion 132b of the second film 132 are continuous along the corners 133b of the first films 133 and cover the corners 133b.

The etching of the first film 133 is stopped at a timing when one portion on the tip side of the first portion 132a of the second film 132 is exposed. The corners 133b of the first films 133 remain at this point in time.

Then, etching of the second film 132 is caused to progress from the exposed first portion 132a. For example, the second film 132 which is a silicon nitride film is etched by supplying an etchant containing phosphoric acid to the second through-portion 152. The first film 133 which is a silicon oxide film and the first layer 171 and the second layer 172 which are metal films have etching resistance to the etchant containing phosphoric acid.

Figure 4B:
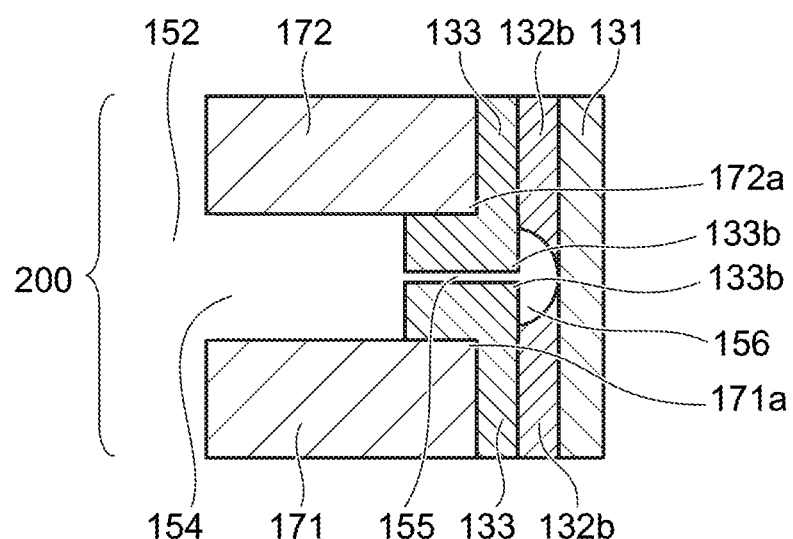

The first portion 132a of the second film 132 is etched and removed; and an air gap 155 is made between the first film 133 formed on the upper surface of the first layer 171 and the first film 133 formed on the lower surface of the second layer 172 as shown in FIG. 4B.

After the first portion 132a is removed, the etching of the second film 132 is caused to progress further; and the second portion 132b that is formed on the side surfaces of the first films 133 is divided in the stacking direction. At this time, the third film 131 functions as an etching stopper; and the etchant does not flow around to the back surface (the surface on the side opposite to the interfaces with the first films 133) side of the second portion 132b.

An air gap 156 is made in the second portion 132b of the second film 132 that was continuous in the stacking direction of the stacked body 200; and the second portion 132b is divided in the stacking direction of the stacked body 200 with the air gap 156 interposed.

Figure 34A:
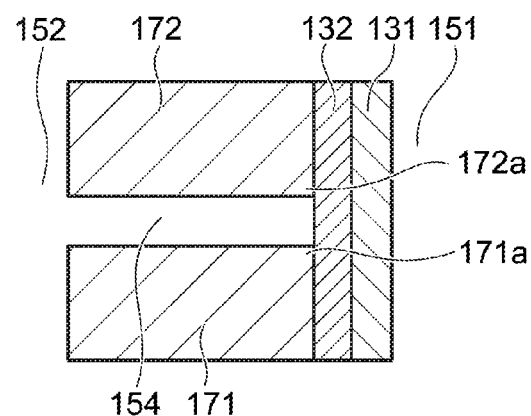
FIGS. 34A to 38B are schematic cross-sectional views showing a method for manufacturing a semiconductor device of reference example.
Figure 34B:
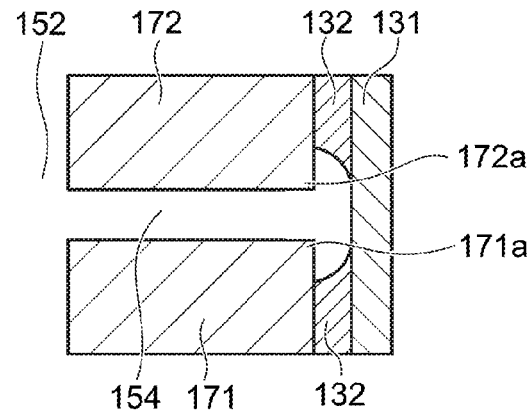

Here, FIG. 34A and FIG. 34B are schematic cross-sectional views showing a reference example of a method for dividing, in the vertical direction, a film formed along the stacking direction (the vertical direction) of a stacked body.

The film 132 in FIG. 34A is a film to be etched (to be divided); FIG. 34A is prior to the etching of the film 132; and FIG. 34B is after the etching of the film 132. The film 131 that functions as an etching stopper is formed on the side surface of the film 132.

The film 132 that is formed on the side surface of the first through-portion 151 is etched by an etchant supplied through the second through-portion 152 and the air gap 154 made between the first layer 171 and the second layer 172.

The film 132 is etched isotropically from the surface exposed in the air gap 154 by the etchant entering from the air gap 154. Also, the film 132 recedes in the vertical direction along the side surface of the first layer 171 due to isotropic etching having the corner 171a of the first layer 171 as a start point. Similarly, the film 132 also recedes in the vertical direction along the side surface of the second layer 172 due to isotropic etching having the corner 172a of the second layer 172 as a start point.

To divide the film 132 in the vertical direction, it is necessary for the etching of the film 132 to progress the amount of the film thickness of the film 132 from the surface exposed in the air gap 154. In the case where the film thickness of the film 132 is thick, the receded amount in the vertical direction increases by this amount; and there is a concern that the amount of the film 132 remaining on the side surface of the first layer 171 and the film 132 remaining on the side surface of the second layer 172 may be little.

In the case where the thickness of the first layer 171 and the thickness of the second layer 172 are thinner than the film thickness of the film 132, there may be cases where the film 132 does not remain on the side surface of the first layer 171 and the side surface of the second layer 172.

Conversely, according to the first embodiment described above, the first film 133 is interposed between the second film 132 to be divided and the first layer 171, and between the second film 132 and the second layer 172.

As shown in FIG. 4A, the corner 133b of the first film 133 covering the corner 171a of the first layer 171 is separated from the corner 171a of the first layer 171 by an amount corresponding to the film thickness of the first film 133. Similarly, the corner 133b of the first film 133 covering the corner 172a of the second layer 172 is separated from the corner 172a of the second layer 172 by an amount corresponding to the film thickness of the first film 133.

After the first portion 132a of the second film 132 interposed between the first films 133 disappears, etching of the second portion 132b progresses isotropically from the corners 133b of the first films 133 as start points; and the second portion 132b is divided in the stacking direction (the vertical direction) of the stacked body 200.

In the reference example shown in FIG. 34A and FIG. 34B, the etching start point of the film 132 is proximal to the side surface of the first layer 171 and the side surface of the second layer 172. Conversely, according to the first embodiment, the etching start point of the second portion 132b of the second film 132 is separated from the corner 171a of the first layer 171 and the corner 172a of the second layer 172. The etching start point of the second portion 132b is not proximal to the side surface of the first layer 171 and the side surface of the second layer 172.

There are distances from the etching start point of the second portion 132b to the portion of the second portion 132b opposing the side surface of the first layer 171, and from the etching start point of the second portion 132b to the portion of the second portion 132b opposing the side surface of the second layer 172. It is desirable for the distances to be not less than the film thickness of the second portion 132b.

Therefore, the second portion 132b can be divided in the vertical direction before the etching progresses to the portion of the second portion 132b opposing the side surface of the first layer 171 and the portion of the second portion 132b opposing the side surface of the second layer 172. Or, the consumed amounts can be suppressed for the portion of the second portion 132b opposing the side surface of the first layer 171 and the portion of the second portion 132b opposing the side surface of the second layer 172 until the dividing of the second portion 132b in the vertical direction ends. The second film 132 can be divided in the vertical direction while causing a sufficient amount of the second film 132 to remain at the portion opposing the side surface of the first layer 171 and the portion opposing the side surface of the second layer 172.

The first film 133 also is divided in the stacking direction (the vertical direction) of the stacked body 200 as shown in FIG. 4A by the etching of the end portion 133a of the first film 133 covering the tip portion of the first portion 132a of the second film 132 in FIG. 3B. Further, the air gap 155 is made between the first films 133 adjacent to each other in the vertical direction by the disappearance of the first portion 132a.

Even after the etching to divide the second portion 132b of the second film 132 has ended, the corners 133b of the first films 133 and the portions extending along the side surface of the first layer 171 and the side surface of the second layer 172 from the corners 133b remain as shown in FIG. 4B. The corners 133b of the first films 133 are adjacent to the region (the air gap 156) between the multiple second portions 132b that are divided.

Accordingly, the etching of the second portion 132b of the second film 132 can be prevented from progressing from portions other than the portions proximal to the corners 133b of the first films 133. After the second portion 132b of the second film 132 is divided in the vertical direction, the portions extending along the side surface of the first layer 171 and the side surface of the second layer 172 from the corners 133b of the first films 133 may be removed by etching.

The length in the vertical direction of the air gap 156 between the second portions 132b of the second film 132 is longer than the length in the vertical direction of the air gap 155 between the first films 133. The spacing between the second portions 132b of the second film 132 divided in the vertical direction with the air gap 156 interposed is larger than the spacing between the first films 133 divided in the vertical direction with the air gap 155 interposed.

According to the first embodiment described above, each of different types of stacked films (the first film 133 and the second film 132) stacked on the side surface of the first through-portion 151 which is a hole or a slit made in the stacked body 200 can be divided in the stacking direction.

For example, in the case where the first layer 171, the second layer 172, and the first film 133 are conductive, shorts between the first layer 171 and the second layer 172 via the first film 133 can be prevented by dividing the first film 133 in the vertical direction. Or, for example, in the case where the first film 133 or the second film 132 includes a charge storage film, the movement in the vertical direction of the stored charge can be prevented.

The first through-portion 151 is, for example, the hole shown in FIG. 9A. For example, FIG. 2B described above corresponds to an A-A cross section of FIG. 9A. The third film 131 is formed on the innermost side proximal to the central axis of the hole 151. The third film 131 is continuous in the circumferential direction of the hole 151. The second portion 132b of the second film 132 is formed to continuously surround the third film 131 from the outer circumferential side. The first film 133 is formed to continuously surround the second portion 132b from the outer circumferential side.

The edge of the end portion 133a of the first film 133 adjacent to the sacrificial layer 173 between the first layer 171 and the second layer 172 is illustrated by a broken line in FIG. 9A. Also, the tip of the first portion 132a of the second film 132 is illustrated by a broken line in FIG. 9A.

Or, the first through-portion 151 is, for example, the slit shown in FIG. 9B. For example, FIG. 2B corresponds to an A-A cross section of FIG. 9B. The third film 131 is formed on the innermost side proximal to the center of the slit 151. The third film 131 is continuous along the contour of the slit 151. The second portion 132b of the second film 132 is formed to continuously surround the third film 131 from the outer side. The first film 133 is formed to continuously surround the second portion 132b from the outer side.

The edge of the end portion 133a of the first film 133 adjacent to the sacrificial layer 173 between the first layer 171 and the second layer 172 is illustrated by a broken line in FIG. 9B. Also, the tip of the first portion 132a of the second film 132 is illustrated by a broken line in FIG. 9B.

Or, the first through-portion 151 is, for example, the slit shown in FIG. 9C. For example, FIG. 2B corresponds to an A-A cross section of FIG. 9C. The first film 133 is formed along the slit 151 on the side surface of the first layer 171 and the side surface of the second layer 172; the second portion 132b of the second film 132 is formed along the slit 151 on the side surface of the first film 133; and the third film 131 is formed along the slit 151 on the side surface of the second portion 132b.

The edge of the end portion 133a of the first film 133 adjacent to the sacrificial layer 173 between the first layer 171 and the second layer 172 is illustrated by a broken line in FIG. 9C. Also, the tip of the first portion 132a of the second film 132 is illustrated by a broken line in FIG. 9C.

Another example of the method for manufacturing the semiconductor device of the first embodiment will now be described.

FIG. 5A to FIG. 8 are schematic cross-sectional views showing another example of the manufacturing method.

In FIG. 5A to FIG. 8, the same components as the components shown in FIG. 1A to FIG. 4B described above are marked with the same reference numerals, and a detailed description thereof is omitted.

After making the first through-portion 151 in the stacked body 200, the sacrificial layer 173 is etched using an etchant or an etching gas supplied to the first through-portion 151. For example, the sacrificial layer 173 which is a silicon oxide film is etched by supplying an etchant containing hydrofluoric acid to the first through-portion 151.

Figure 5A:
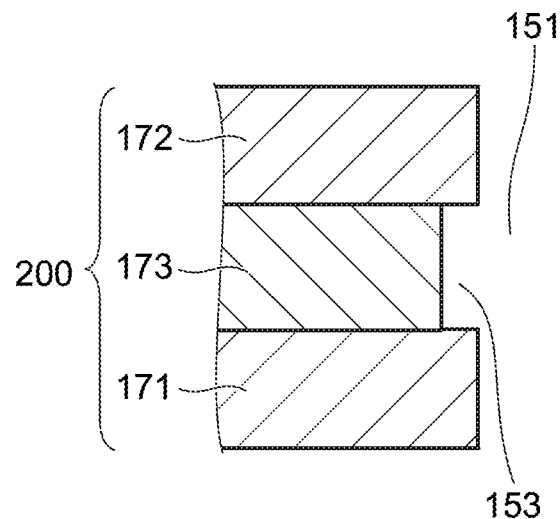

The etching of the sacrificial layer 173 progresses from the end surface of the sacrificial layer 173 exposed in the first through-portion 151; and the end surface of the sacrificial layer 173 recedes in the diametral direction or width direction of the first through-portion 151 so that the end surface of the sacrificial layer 173 separates from the first through-portion 151 as shown in FIG. 5A.

The air gap 153 that communicates with the first through-portion 151 is made between the first layer 171 and the second layer 172 by the etching of the sacrificial layer 173. One portion of the sacrificial layer 173 remains between the first layer 171 and the second layer 172.

Figure 5B:
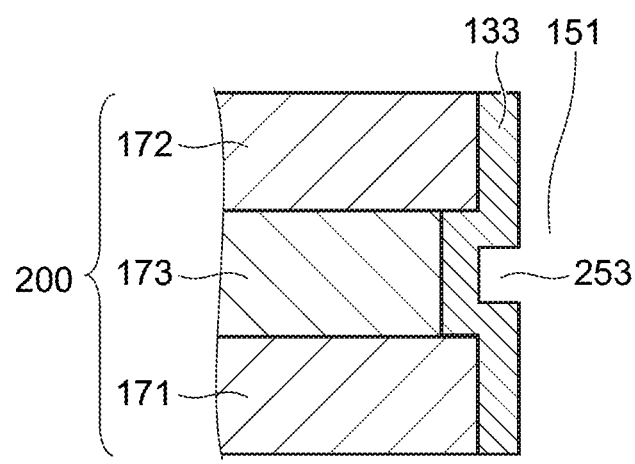

Then, the first film 133 shown in FIG. 5B is formed in the air gap 153 by CVD or ALD. The first film 133 is formed also on the side surface of the second layer 172 adjacent to the first through-portion 151 and the side surface of the first layer 171 adjacent to the first through-portion 151.

The first film 133 is formed conformally along the side surface of the second layer 172, the lower surface of the second layer 172 adjacent to the air gap 153 (the surface opposing the first layer 171), the side surface of the sacrificial layer 173 adjacent to the air gap 153, the upper surface of the first layer 171 adjacent to the air gap 153 (the surface opposing the second layer 172), and the side surface of the first layer 171.

In the example shown in FIG. 5A, the receded amount of the sacrificial layer 173 from the first through-portion 151 is less than that of the example shown in FIG. 1C described above; and the air gap 153 is filled with the first film 133. However, the film thickness of the first film 133 is thinner than ½ of the height (the length in the stacking direction) of the air gap 153. Therefore, a stepped portion that reflects the stepped portion between the air gap 153 and the side surface of the first layer 171, and the stepped portion between the air gap 153 and the side surface of the second layer 172 is formed in the side surface of the first film 133 on the first through-portion 151 side. In other words, an air gap 253 that extends from the first through-portion 151 toward the sacrificial layer 173 is made in the side surface of the first film 133 on the first through-portion 151 side.

Figure 6A:
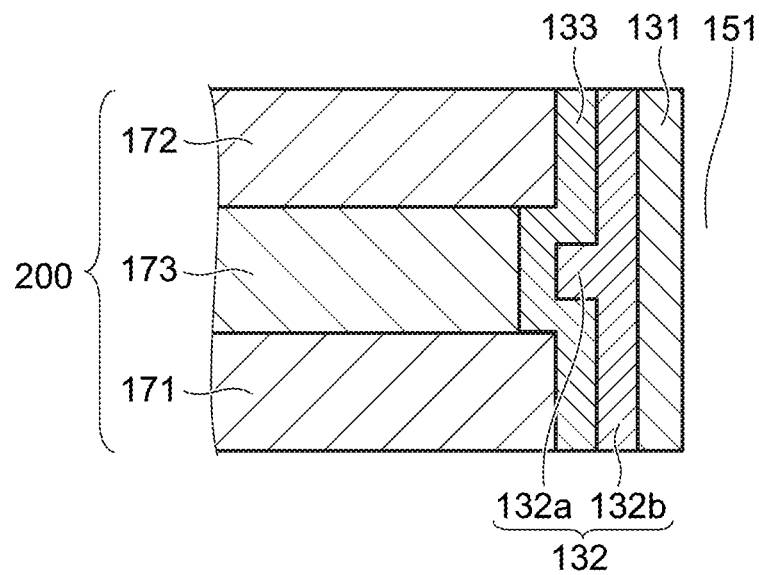

Then, the second film 132 shown in FIG. 6A is formed in the air gap 253 and on the side surface of the first film 133 adjacent to the first through-portion 151. The second film 132 includes the first portion 132a that is filled into the air gap 253, and the second portion 132b that is provided on the side surface of the first film 133 and extends in the stacking direction of the stacked body 200.

The first portion 132a is provided as one body with the second portion 132b and extends in a protruding configuration from the second portion 132b toward the sacrificial layer 173.

The third film 131 is formed on the side surface of the second portion 132b of the second film 132 adjacent to the first through-portion 151. The first through-portion 151 may be filled with the first film 133, the second film 132, and the third film 131; or one portion of the first through-portion 151 may remain as a cavity at the side of the third film 131. Or, another film may be formed on the side surface of the third film 131.

Figure 6B:
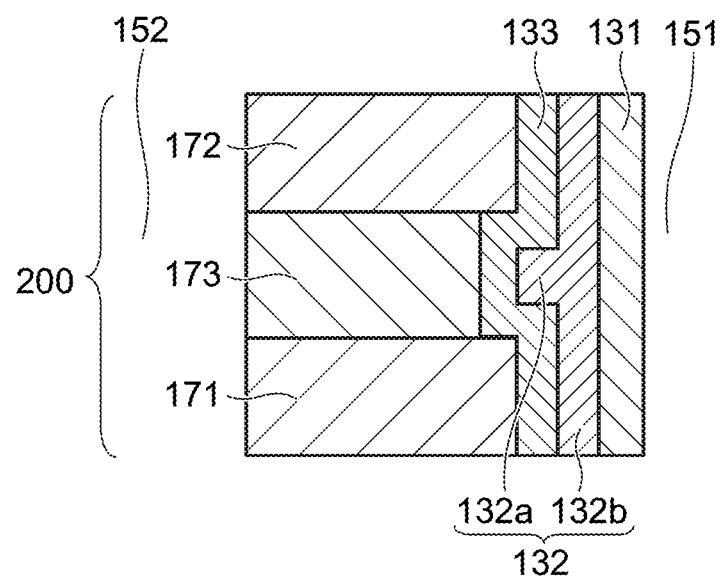

Then, the second through-portion 152 is made as shown in FIG. 6B in the region of the stacked body 200 where the sacrificial layer 173 remains. The surface of the first layer 171 along the second through-portion 152, the surface of the second layer 172 along the second through-portion 152, and the surface of the sacrificial layer 173 along the second through-portion 152 are exposed in the second through-portion 152.

Then, the sacrificial layer 173 that remains between the first layer 171 and the second layer 172 is etched using an etchant or an etching gas supplied to the second through-portion 152. For example, the sacrificial layer 173 which is a silicon oxide film is etched by supplying an etchant containing hydrofluoric acid to the second through-portion 152.

Figure 7A:
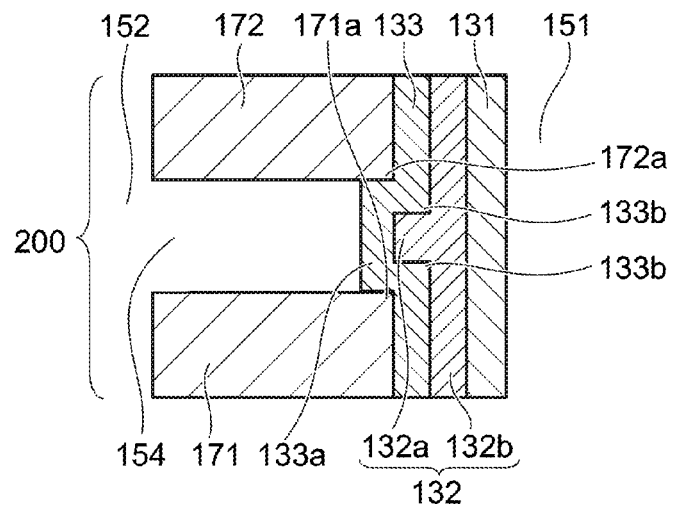

The air gap 154 that communicates with the second through-portion 152 is made between the first layer 171 and the second layer 172 as shown in FIG. 7A by the etching of the sacrificial layer 173. The end portion 133a of the first film 133 is exposed in the air gap 154.

Figure 7B:
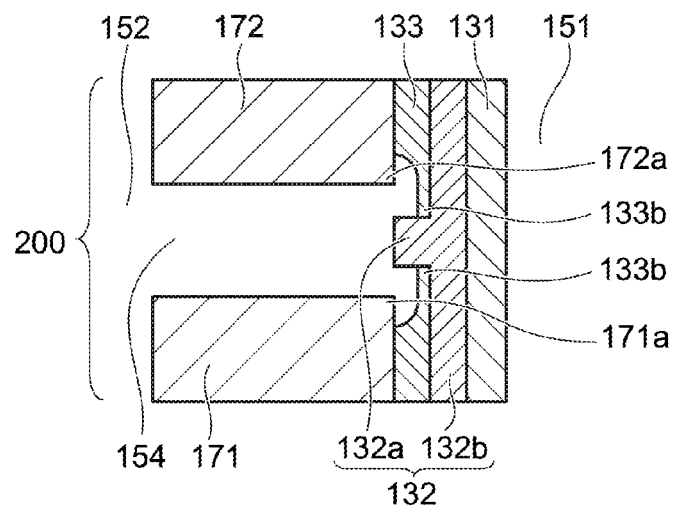

Then, the end portion 133a of the first film 133 exposed in the second through-portion 152 through the air gap 154 is etched. The etching of the first film 133 is caused to progress from the end portion 133a; and the first portion 132a of the second film 132 is exposed as shown in FIG. 7B.

For example, the first film 133 which is a silicon oxide film is etched by supplying an etchant containing hydrofluoric acid to the second through-portion 152. For example, the second film 132 which is a silicon nitride film has etching resistance to the etchant containing hydrofluoric acid.

The etching of the first film 133 is stopped at a timing when one portion on the tip side of the first portion 132a of the second film 132 is exposed. The corners 133b of the first films 133 remain; and the base on the second portion 132b side of the first portion 132a of the second film 132 is interposed between the corners 133b in the stacking direction of the stacked body 200 as shown in FIG. 7B. At this point in time, the side surface of the second portion 132b of the second film 132 on the first film 133 side is covered with the first film 133.

Then, etching of the second film 132 is caused to progress from the exposed first portion 132a. For example, the second film 132 which is a silicon nitride film is etched by supplying an etchant containing phosphoric acid to the second through-portion 152. The first film 133 which is a silicon oxide film, and the first and second layers 171, 172 which are metal films have etching resistance to the etchant containing phosphoric acid.

Figure 8:
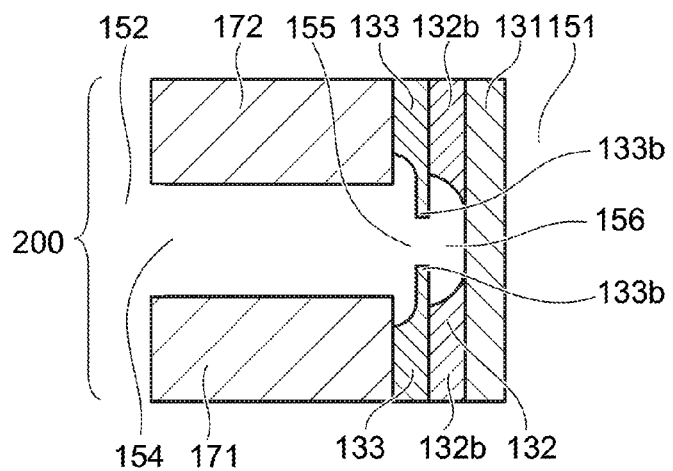

As shown in FIG. 8, the first portion 132a of the second film 132 is etched and removed. After the first portion 132a is removed, the etching of the second film 132 is caused to progress further; and the second portion 132b formed on the side surfaces of the first films 133 is divided in the stacking direction. At this time, the third film 131 functions as an etching stopper; and the etchant does not flow around to the back surface (the surface on the side opposite to the interfaces with the first films 133) side of the second portion 132b.

The air gap 156 is made in the second portion 132b of the second film 132 that was continuous in the stacking direction of the stacked body 200; and the second portion 132b is divided in the stacking direction of the stacked body 200 with the air gap 156 interposed.

In the example shown in FIG. 5A to FIG. 8 as well, the first film 133 is interposed between the second film 132 to be divided and the first layer 171, and between the second film 132 and the second layer 172.

As shown in FIG. 7A, the corner 133b of the first film 133 covering the corner 171a of the first layer 171 is separated from the corner 171a of the first layer 171 by an amount corresponding to the film thickness of the first film 133. Similarly, the corner 133b of the first film 133 covering the corner 172a of the second layer 172 is separated from the corner 172a of the second layer 172 by an amount corresponding to the film thickness of the first film 133.

After the first portion 132a of the second film 132 interposed between the first films 133 disappears, etching of the second portion 132b progresses isotropically from the corners 133b of the first films 133 as start points; and the second portion 132b is divided in the stacking direction (the vertical direction) of the stacked body 200.

The etching start point of the second portion 132b of the second film 132 is separated from the corner 171a of the first layer 171 and the corner 172a of the second layer 172 and is not proximal to the side surface of the first layer 171 and the side surface of the second layer 172. There are distances from the etching start point of the second portion 132b to the portion of the second portion 132b opposing the side surface of the first layer 171, and from the etching start point of the second portion 132b to the portion of the second portion 132b opposing the side surface of the second layer 172. It is desirable for the distances to be not less than the film thickness of the second portion 132b.

Therefore, the second portion 132b can be divided in the vertical direction before the etching progresses to the portion of the second portion 132b opposing the side surface of the first layer 171 and the portion of the second portion 132b opposing the side surface of the second layer 172. Or, the consumed amounts can be suppressed for the portion of the second portion 132b opposing the side surface of the first layer 171 and the portion of the second portion 132b opposing the side surface of the second layer 172 until the dividing of the second portion 132b in the vertical direction ends. The second film 132 can be divided in the vertical direction while causing a sufficient amount of the second film 132 to remain at the portion of opposing the side surface of the first layer 171 and the portion opposing the side surface of the second layer 172.

The first film 133 also is divided in the stacking direction (the vertical direction) of the stacked body 200 as shown in FIG. 7B by the end portion 133a of the first film 133 shown in FIG. 7A being etched.

In the method shown in FIG. 5A to FIG. 8 as well, each of different types of stacked films (the first film 133 and the second film 132) stacked on the side surface of the first through-portion 151 which is a hole or a slit made in the stacked body 200 can be divided in the stacking direction.

Even after the etching to divide the second portion 132b of the second film 132 has ended, the corners 133b of the first films 133 and the portions extending along the side surface of the first layer 171 and the side surface of the second layer 172 from the corners 133b remain as shown in FIG. 8. Accordingly, the etching of the second portion 132b of the second film 132 can be prevented from progressing from portions other than the portions proximal to the corners 133b of the first films 133.

One portion of the first film 133 protrudes in the vertical direction to be adjacent to the region (the air gap 156) between the multiple second portions 132b that are divided. The corner 133b of the first film 133 remains at the tip of the protruding portion. The portion of the first film 133 protruding in the vertical direction may be removed by etching after dividing the second portion 132b of the second film 132 in the vertical direction.

A second embodiment will now be described.

In the second embodiment, a semiconductor memory device that includes, for example, a memory cell array having a three-dimensional structure will be described as the semiconductor device.

Figure 10:
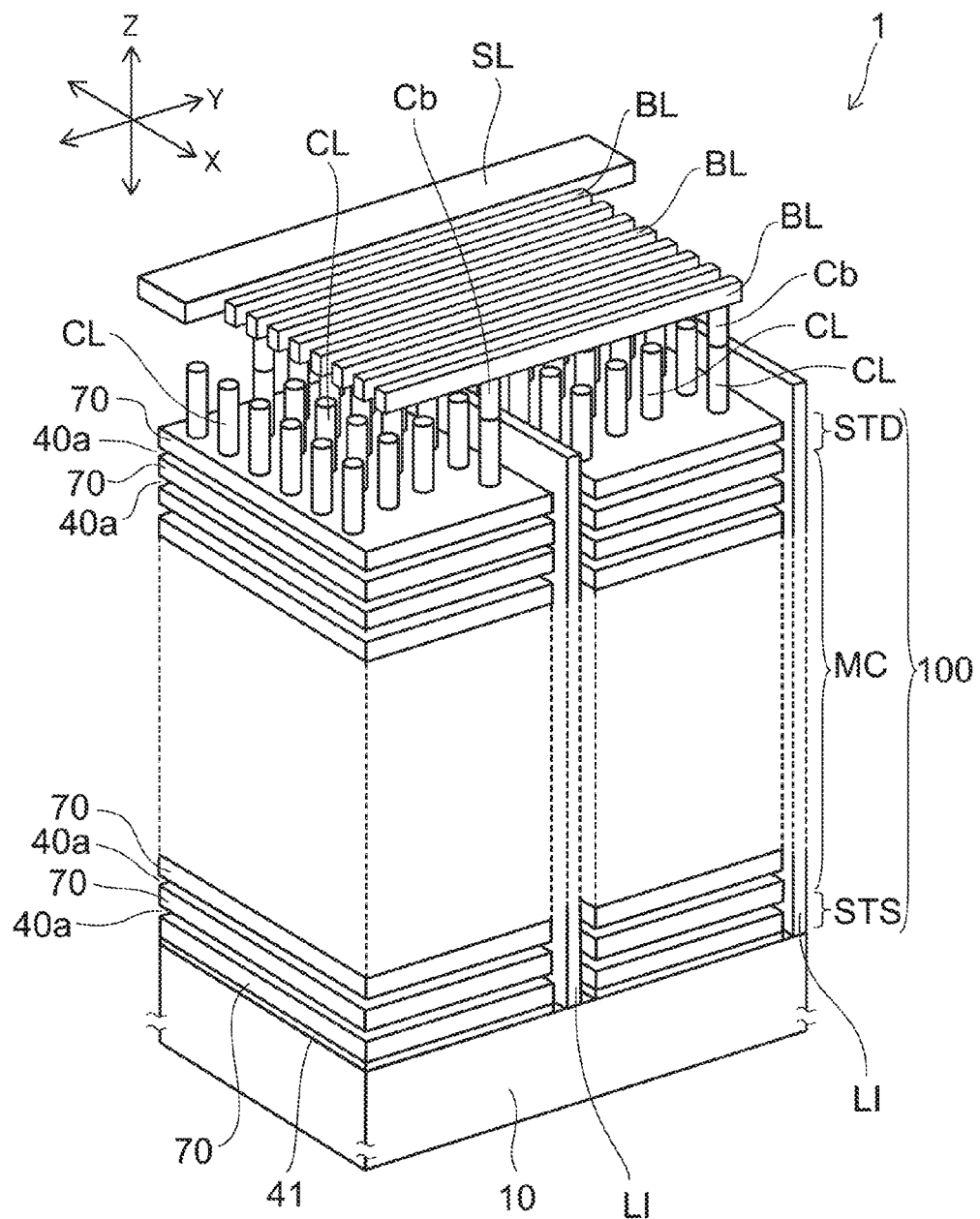
FIG. 10 is a schematic perspective view of a memory cell array of a semiconductor device of a second embodiment.

FIG. 10 is a schematic perspective view of a memory cell array 1 of the semiconductor device of the second embodiment.

In FIG. 10, two mutually-orthogonal directions parallel to a major surface of a substrate 10 are taken as an X-direction and a Y-direction; and a direction orthogonal to both the X-direction and the Y-direction is taken as a Z-direction (a stacking direction).

As shown in FIG. 10, the memory cell array 1 includes the substrate 10, a stacked body 100 provided above the substrate 10, a plurality of columnar units CL, a plurality of interconnect units LI, and upper layer interconnects provided above the stacked body 100. In FIG. 10, for example, bit lines BL and a source line SL are shown as the upper layer interconnects.

The interconnect unit LI is provided between the substrate 10 and the upper layer interconnect, and spreads in a plate configuration in the Z-direction and the X-direction. The interconnect unit LI divides the stacked body 100 into multiple blocks in the Y-direction.

The columnar units CL are formed in a circular columnar or an elliptical columnar configuration extending in the Z-direction through the stacked body 100. For example, the plurality of columnar units CL have a staggered arrangement. Or, the plurality of columnar units CL may have a square lattice arrangement along the X-direction and the Y-direction.

The multiple bit lines BL are separated from each other in the X-direction; and each of the bit lines BL extends in the Y-direction.

The upper ends of semiconductor films 20 of the columnar units CL described below are connected to the bit lines BL via contact Cb. The plurality of columnar units CL, each of which is selected from each of blocks separated in the Y-direction by the interconnect unit LI, are connected to one common bit line BL.

Figure 11:
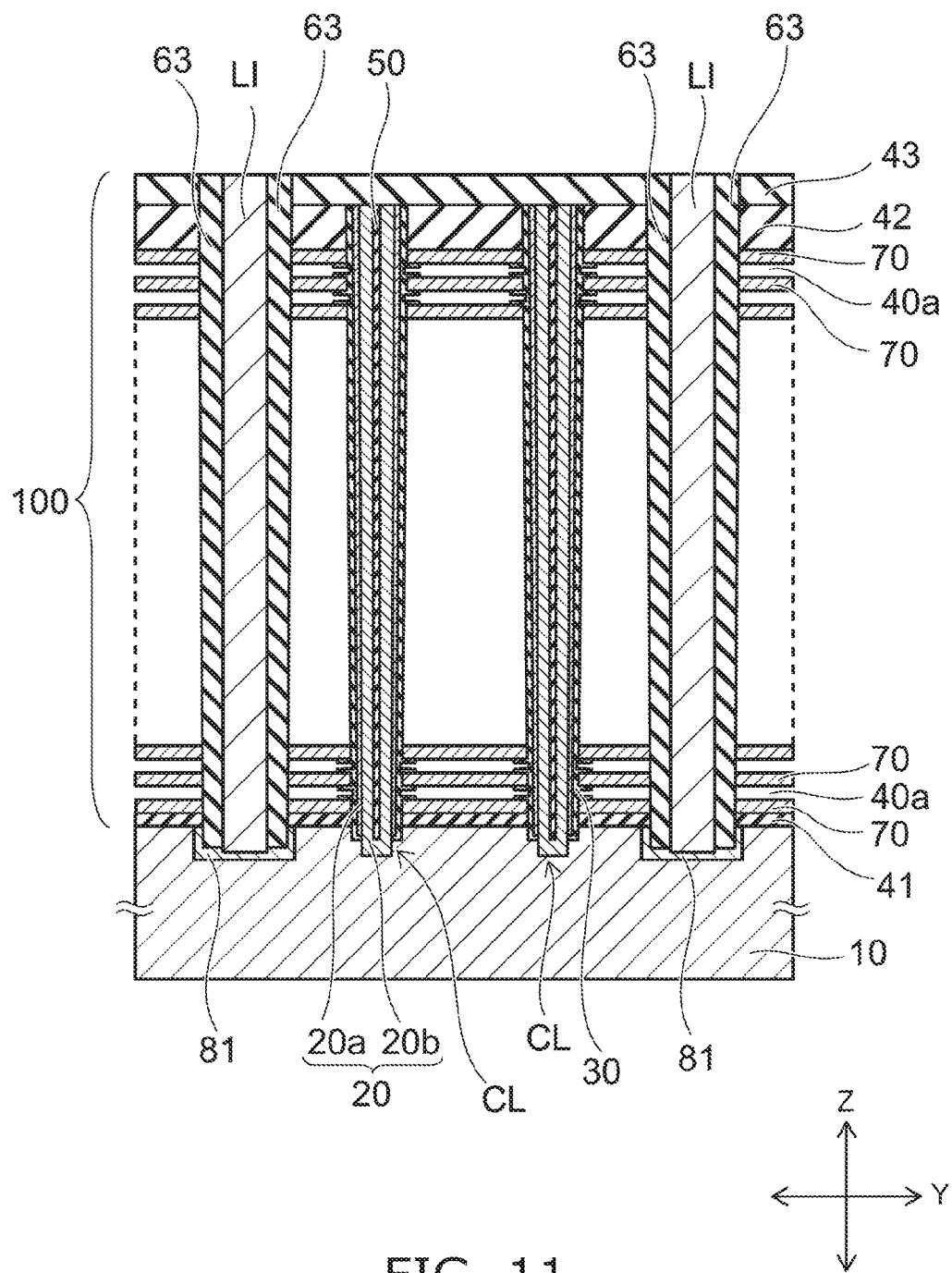
FIG. 11 is a schematic cross-sectional view of the memory cell array of the semiconductor device of the second embodiment.

FIG. 11 is a schematic cross-sectional view of the substrate 10, the stacked body 100, the columnar units CL, and the interconnect units LI. The Y-direction and the Z-direction shown in FIG. 11 correspond to the Y-direction and the Z-direction shown in FIG. 10. Insulating films 42, 43, and 63 shown in FIG. 11 are not shown in FIG. 10.

The stacked body 100 includes a plurality of electrode layers 70 stacked on the substrate 10 via an insulating film 41. The plurality of electrode layers 70 are stacked, with the air gap 40a interposed, at a prescribed period in a direction (the Z-direction) perpendicular to the major surface of the substrate 10. The electrode layer 70 contains a metal or a metal silicide.

The air gap 40a is made between the electrode layer 70 and the electrode layer 70 adjacent to each other in the stacking direction. The insulating film 41 is provided between the substrate 10 and the electrode layer 70 of the lowermost layer. The insulating film 42 is provided on the electrode layer 70 of the uppermost layer; and the insulating film 43 is provided on the insulating film 42.

Figure 12:
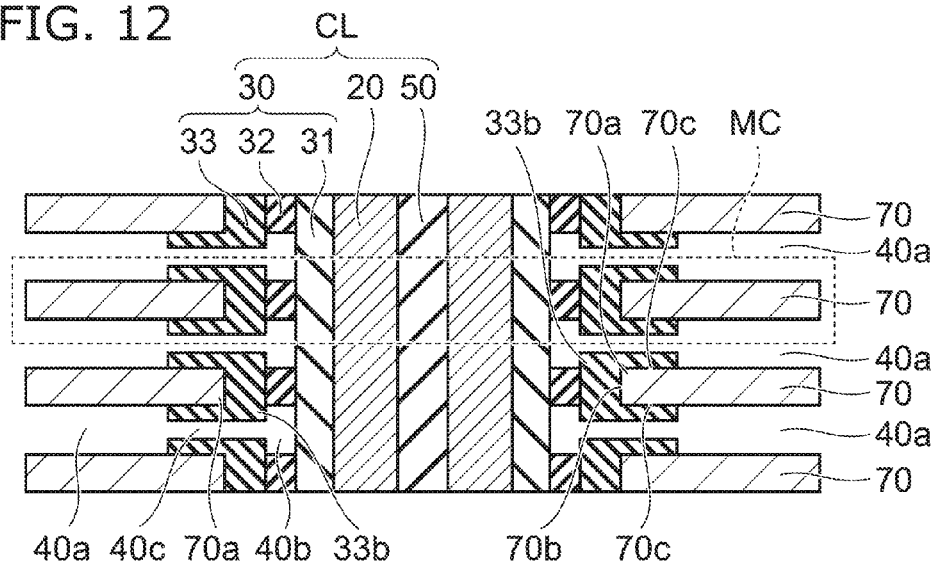
FIG. 12 is an enlarged schematic cross-sectional view of some of the memory cell array shown in FIG. 11.

FIG. 12 is an enlarged cross-sectional view of some of the components shown in FIG. 11.

The columnar unit CL is a stacked film including a memory film 30, the semiconductor film 20, and a core film 50 that is insulative. The semiconductor film 20 extends in a pipe-like configuration through the stacked body 100 in the stacking direction (the Z-direction). The core film 50 is provided on the inner side of the semiconductor film 20 having the pipe-like configuration.

The upper end of the semiconductor film 20 is connected to the bit line BL via the contact Cb shown in FIG. 10. The lower end of the semiconductor film 20 is connected to the substrate 10 as shown in FIG. 11.

The memory film 30 includes a tunneling insulating film 31, a charge storage film 32, and a blocking insulating film 33. The blocking insulating film 33, the charge storage film 32, and the tunneling insulating film 31 are provided between the electrode layer 70 and the semiconductor film 20 in order from the electrode layer 70 side. The tunneling insulating film 31 contacts the semiconductor film 20. The blocking insulating film 33 contacts the electrode layer 70. The charge storage film 32 is provided between the blocking insulating film 33 and the tunneling insulating film 31.

The tunneling insulating film 31 and the semiconductor film 20 extend to be continuous in the stacking direction of the stacked body 100. The charge storage film 32 is divided in the stacking direction with an air gap 40b interposed. An air gap 40c that communicates with the air gap 40a and the air gap 40b is made between the air gap 40a between the electrode layers 70 and the air gap 40b between the charge storage films 32; and the blocking insulating film 33 is divided in the stacking direction with the air gap 40c interposed. The charge storage film 32 is not interposed between the blocking insulating films 33 separated above and below.

The length in the stacking direction of the air gap 40b is longer than the length in the stacking direction of the air gap 40c. In other words, the spacing between the multiple charge storage films 32 separated from each other in the stacking direction with the air gap 40b interposed is larger than the spacing between the multiple blocking insulating films 33 separated from each other in the stacking direction with the air gap 40c interposed.

The length in the stacking direction of the air gap 40a is longer than the length in the stacking direction of the air gap 40c. In other words, the spacing between the multiple electrode layers 70 separated from each other in the stacking direction with the air gap 40a interposed is larger than the spacing between the multiple blocking insulating films 33 separated from each other in the stacking direction with the air gap 40c interposed.

The charge storage film 32 is provided between the blocking insulating film 33 and the semiconductor film 20 and surrounds the semiconductor film 20 from the outer circumferential side.

The side surface of the semiconductor film 20 opposing the charge storage film 32 and the side surface of the semiconductor film 20 opposing the air gap 40b are continuous along the stacking direction.

The charge storage film 32, the tunneling insulating film 31, and the semiconductor film 20 do not enter between the electrode layers 70 adjacent to each other in the stacking direction.

The electrode layer 70 has a side surface 70b opposing the charge storage film 32, a surface 70c opposing the air gaps 40a and 40c and formed to be continuous from the side surface 70b, and a corner 70a between the side surface 70b and the surface 70c.

The blocking insulating film 33 is provided on the corner 70a, the side surface 70b, and one portion of the surface 70c of the electrode layer 70, and covers the corner 70a, the side surface 70b, and the one portion of the surface 70c of the electrode layer 70. The blocking insulating film 33 is not formed on the entire surface 70c of the electrode layer 70. Only one portion of the surface 70c of the electrode layer 70 in the vicinity of the corner 70a is covered with the blocking insulating film 33.

The blocking insulating film 33 has a corner 33b provided along the corner 70a of the electrode layer 70; and the corner 33b protrudes in the stacking direction from the end surface of the charge storage film 32 in the stacking direction and is adjacent to the air gap 40b between the charge storage films 32.

The semiconductor film 20, the memory film 30, and the electrode layer 70 are included in a memory cell MC. One memory cell MC in FIG. 12 is illustrated schematically by a broken line. The memory cell MC has a vertical transistor structure in which the electrode layer 70 surrounds, with the memory film 30 interposed, the periphery of the semiconductor film 20.

In the memory cell MC having the vertical transistor structure, the semiconductor film 20 functions as a channel; and the electrode layer 70 functions as a control gate. The charge storage film 32 functions as a data storage layer that stores charge injected from the semiconductor film 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 is an insulative film having many trap sites that trap charge and includes, for example, a silicon nitride film. Or, the charge storage film 32 may be a floating gate that is conductive.

The tunneling insulating film 31 is used as a potential barrier when the charge is injected from the semiconductor film 20 into the charge storage film 32 or when the charge stored in the charge storage film 32 is released into the semiconductor film 20. The tunneling insulating film 31 includes, for example, a silicon oxide film.

The blocking insulating film 33 prevents the charge stored in the charge storage film 32 from being released into the electrode layers 70. Also, the blocking insulating film 33 suppresses back-tunneling of electrons from the electrode layer 70 in the erasing operation. The blocking insulating film 33 includes, for example, at least one of a silicon oxide film and a metal oxide film.

The memory film 30 is provided between the inner circumferential surface of the electrode layer 70 and the outer circumferential surface of the semiconductor film 20 opposing the inner circumferential surface of the electrode layer 70. The outer circumferential surface of the semiconductor film 20 is not exposed in the air gap 40b and is covered with and protected by the tunneling insulating film 31.

A film is provided to be continuous between the inner circumferential surface of the electrode layer 70 and the outer circumferential surface of the semiconductor film 20 in a direction connecting the inner circumferential surface to the outer circumferential surface. The electrode layers 70 are physically connected to the columnar unit CL via the film and are supported by the columnar unit CL.

As shown in FIG. 10, a drain-side select transistor STD is provided at the upper end portion of the columnar unit CL; and a source-side select transistor STS is provided at the lower end portion of the columnar unit CL. For example, the electrode layer 70 of the lowermost layer functions as a control gate of the source-side select transistor STS. For example, the electrode layer 70 of the uppermost layer functions as a control gate of the drain-side select transistor STD.

The plurality of memory cells MC are provided between the drain-side select transistor STD and the source-side select transistor STS. The memory cells MC, the drain-side select transistor STD, and the source-side selection transistor STS are connected in series via the semiconductor film 20 and are included in one memory string. For example, the memory strings have a staggered arrangement in a surface direction parallel to the X-Y plane; and the memory cells MC are provided three-dimensionally in the X-direction, the Y-direction, and the Z-direction.

As shown in FIG. 11, the insulating film 63 is provided on the side surface of the interconnect unit LI dividing the stacked body 100 in the Y-direction. The insulating film 63 is provided between the stacked body 100 and the interconnect unit LI.

The interconnect unit LI is, for example, a metal film containing tungsten as a major component. The upper end of the interconnect unit LI is connected to the source line SL provided above the stacked body 100 and shown in FIG. 10. As shown in FIG. 11, the lower end of the interconnect unit LI contacts the substrate 10. Also, the lower end of the semiconductor film 20 contacts the substrate 10. The substrate 10 is, for example, a silicon substrate doped with an impurity. Accordingly, the lower end of the semiconductor film 20 is electrically connectable to the source line SL via the substrate 10 and the interconnect unit LI.

As shown in FIG. 11, semiconductor regions 81 are formed in the surface of the substrate 10 reached by the lower ends of the interconnect units LI. The plurality of semiconductor regions 81 are provided to correspond to the plurality of interconnect units LI. The plurality of semiconductor regions 81 include a p-type semiconductor region 81 and an n-type semiconductor region 81. The p-type semiconductor region 81 supplies holes to the semiconductor film 20 via the substrate 10 in the erasing operation. In the read-out operation, electrons are supplied from the interconnect unit LI to the semiconductor film 20 via the n-type semiconductor region 81 and the substrate 10.

By controlling the potential applied to the electrode layer 70 of the lowermost layer provided on the surface (the major surface) of the substrate 10 with the insulating film 41 interposed, a channel is induced in the surface of the substrate 10 between the semiconductor region 81 and the lower end of the semiconductor film 20. And a current can be caused to flow between the semiconductor region 81 and the lower end of the semiconductor film 20.

The electrode layer 70 of the lowermost layer functions as a control gate for inducing the channel in the surface of the substrate 10; and the insulating film 41 functions as a gate insulator film. Because the insulating film 41 which has a dielectric constant that is higher than that of air is between the surface of the substrate 10 and the electrode layer 70 of the lowermost layer instead of the air gap, high-speed operations are possible due to the capacitive coupling between the electrode layer 70 of the lowermost layer and the surface of the substrate 10.

On the other hand, the air gap 40a is made between the electrode layers 70 which are the control gates of the memory cells adjacent to each other in the stacking direction (the Z-direction). Therefore, the interconnect capacitance between the electrode layers 70 above and below can be reduced; and high-speed operations of the memory cell MC are possible. Further, interference between adjacent cells such as threshold fluctuation due to capacitive coupling between the electrode layers 70 above and below, etc., can be suppressed.

Also, because the charge storage film 32 is divided in the stacking direction as shown in FIG. 12, the charge that is stored in the charge storage film 32 does not escape in the stacking direction; and the charge retention characteristics of the memory cell MC are superior.

Further, because the charge storage film 32 is provided to oppose only the side surface 70b of the surface of the electrode layer 70 on the columnar unit CL side, the charge can be stored in the memory cell MC exclusively in the charge storage film 32 at the position where the electrode layer 70 and the semiconductor film 20 oppose; and the efficiency of the erasing/programming of the data from and to the memory cell MC is increased.

Also, because blocking insulating films 33 and electrode layers 70 above and below are formed without the charge storage film 32 being interposed, the total film thickness of the stacked body 100 can be set to be thin; and, for example, the processing is easy for a memory hole MH described below forming the columnar unit CL extending through the stacked body 100 and the like.

The blocking insulating film 33 is provided not only on the side surface 70b of the electrode layer 70 opposing the charge storage film 32 but also on one portion of the surface 70c that is continuous, with the corner 70a interposed, from the side surface 70b. In other words, the surface of the electrode layer 70 on the columnar unit CL side including the corner 70a is covered with the blocking insulating film 33. The blocking insulating film 33 thus formed reliably prevents the diffusion of the elements (e.g., metallic elements) and electrons included in the electrode layer 70 into the charge storage film 32, the tunneling insulating film 31, or the semiconductor film 20.

The blocking insulating film 33 is not formed on the entire surface 70c of the electrode layer 70; and the electrode layer 70 also includes a portion that opposes the electrode layer 70 above or below without the blocking insulating film 33 being interposed. By limiting the portion of the surface 70c of the electrode layer 70 where the blocking insulating film 33 is formed to be one portion on the columnar unit CL side, the capacitance increase between the electrode layers 70 above and below can be suppressed.

A method for forming the memory cell array 1 of the semiconductor device of the second embodiment will now be described with reference to FIG. 13 to FIG. 33B.

Figure 13:
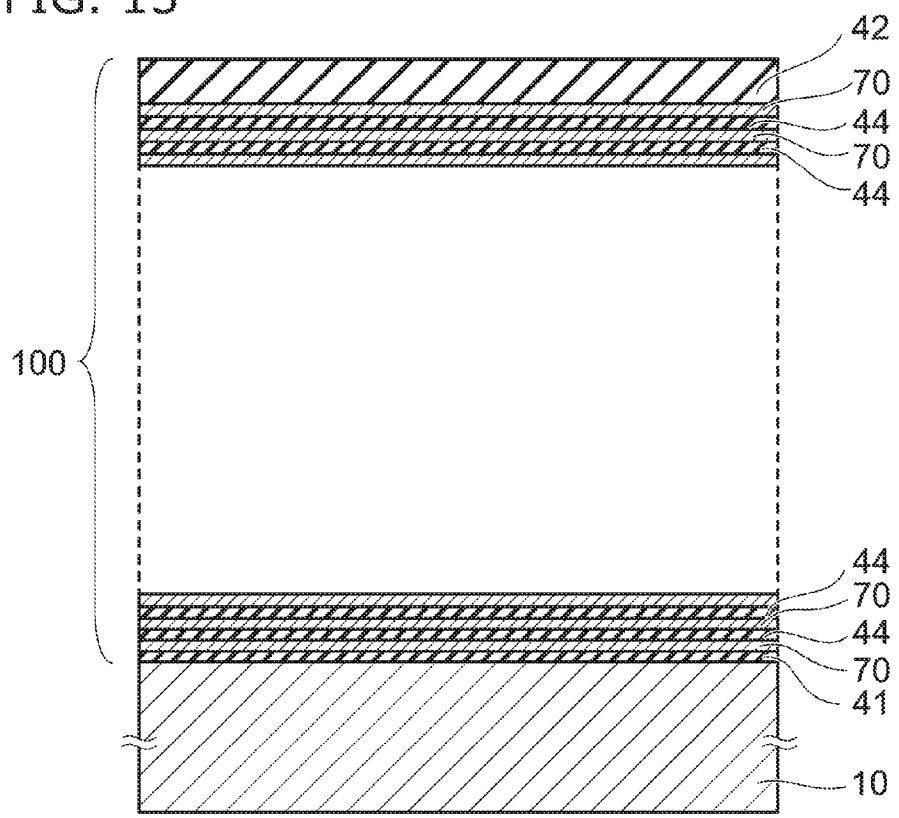
FIGS. 13 to 33B are schematic cross-sectional views showing a method for manufacturing the semiconductor device of the second embodiment.

As shown in FIG. 13, the stacked body 100 is formed on the substrate 10. The substrate 10 is, for example, a semiconductor substrate and is a silicon substrate.

The insulating film 41 is formed on a major surface (the surface) of the substrate 10; and the electrode layer 70 as a first material layer and a sacrificial layer 44 as a second material layer are stacked alternately on the insulating film 41. The processes of alternately stacking the electrode layer 70 and the sacrificial layer 44 is repeated; and the plurality of electrode layers 70 and the plurality of sacrificial layers 44 are formed above the substrate 10.

The electrode layer 70 is, for example, a metal film. For example, the metal film contains mainly tungsten or molybdenum. The sacrificial layer 44 is, for example, a silicon oxide film. Or, the sacrificial layer 44 is a different type of metal film from the electrode layer 70. For example, the electrode layer 70 is a tungsten film; and the sacrificial layer 44 is a molybdenum film.

The electrode layer 70 of the lowermost layer is formed on the insulating film 41; and the sacrificial layer 44 of the lowermost layer is formed on the electrode layer 70 of the lowermost layer. The insulating film 42 is formed on the electrode layer 70 of the uppermost layer.

Figure 14:
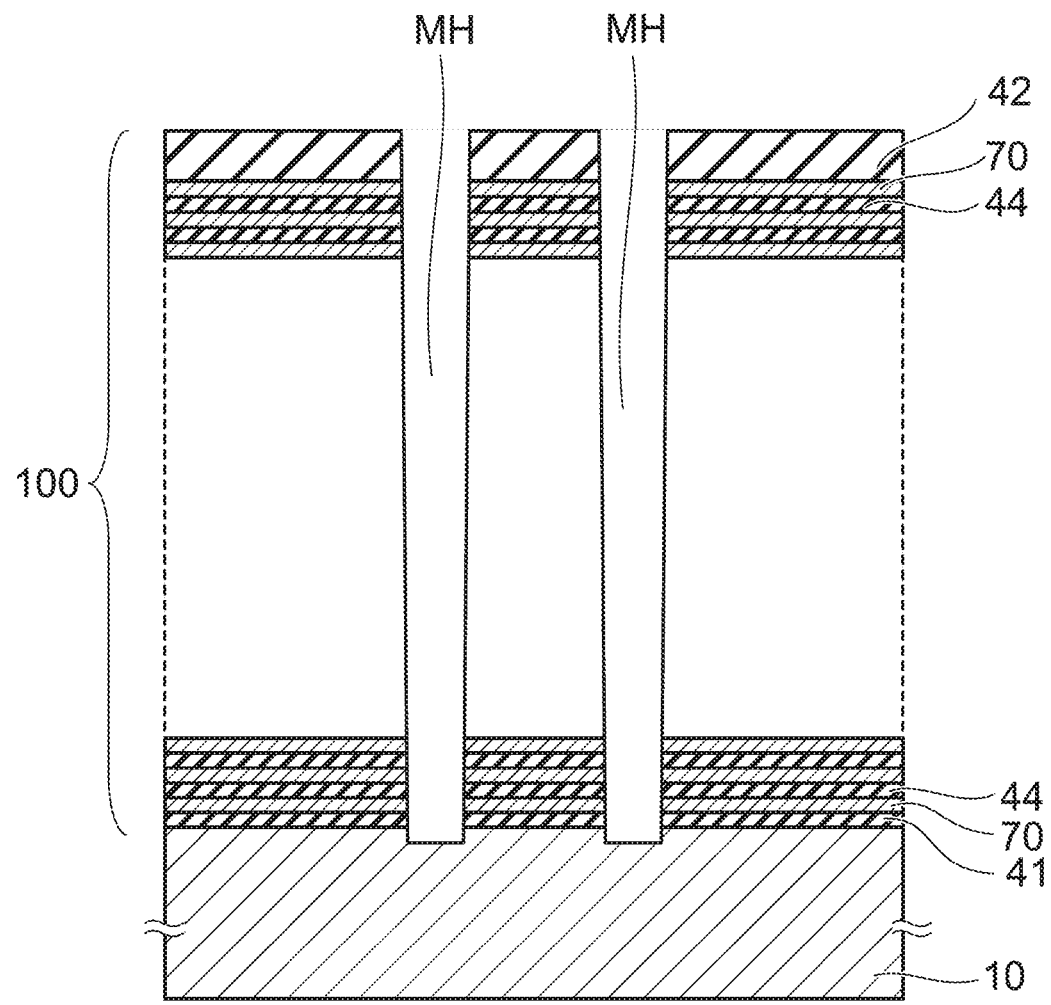

Then, a plurality of memory holes MH are made in the stacked body 100 as shown in FIG. 14. The memory holes MH are made by RIE using a not-shown mask. The memory holes MH extend in the stacking direction of the stacked body 100, pierce the stacked body 100, and reach the substrate 10.

After making the memory holes MH, the processes of the first embodiment described above are applicable to the stacked body 100.

FIG. 24A to FIG. 27B are enlarged cross sections of a portion including two layers of the electrode layers 70 and the sacrificial layer 44 or the air gap 40a provided between the electrode layers 70 for the stacked body 100 of the second embodiment.

FIG. 24A to FIG. 27B may correspond to the processes shown in FIG. 1A to FIG. 4B of the first embodiment.

Figure 24A:
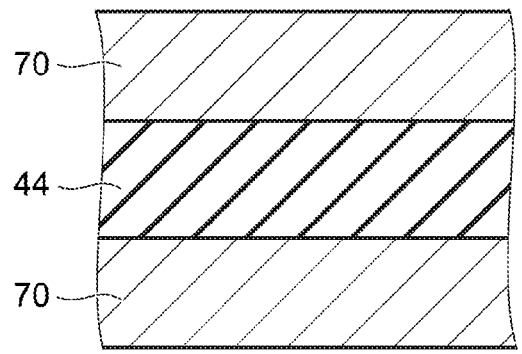
Figure 24B:
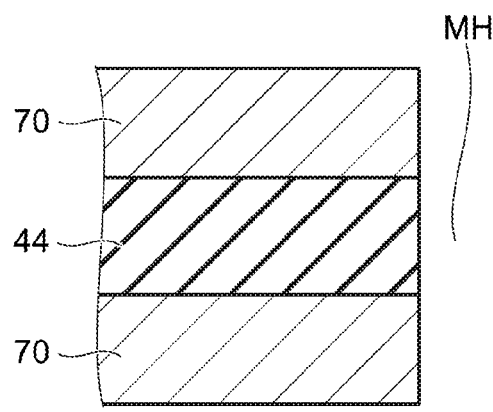

As shown in FIG. 24B, the memory hole MH is made on the right side of the cross section shown in FIG. 24A.

The side surfaces of the electrode layers 70 along the memory hole MH and the side surface of the sacrificial layer 44 along the memory hole MH are exposed in the memory hole MH.

Then, the sacrificial layer 44 is etched using an etchant or an etching gas supplied to the memory hole MH. For example, the sacrificial layer 44 which is a silicon oxide film is etched by supplying an etchant containing hydrofluoric acid to the memory hole MH. The electrode layers 70 have etching resistance to the etchant containing hydrofluoric acid and are, for example, metal films.

Figure 15:
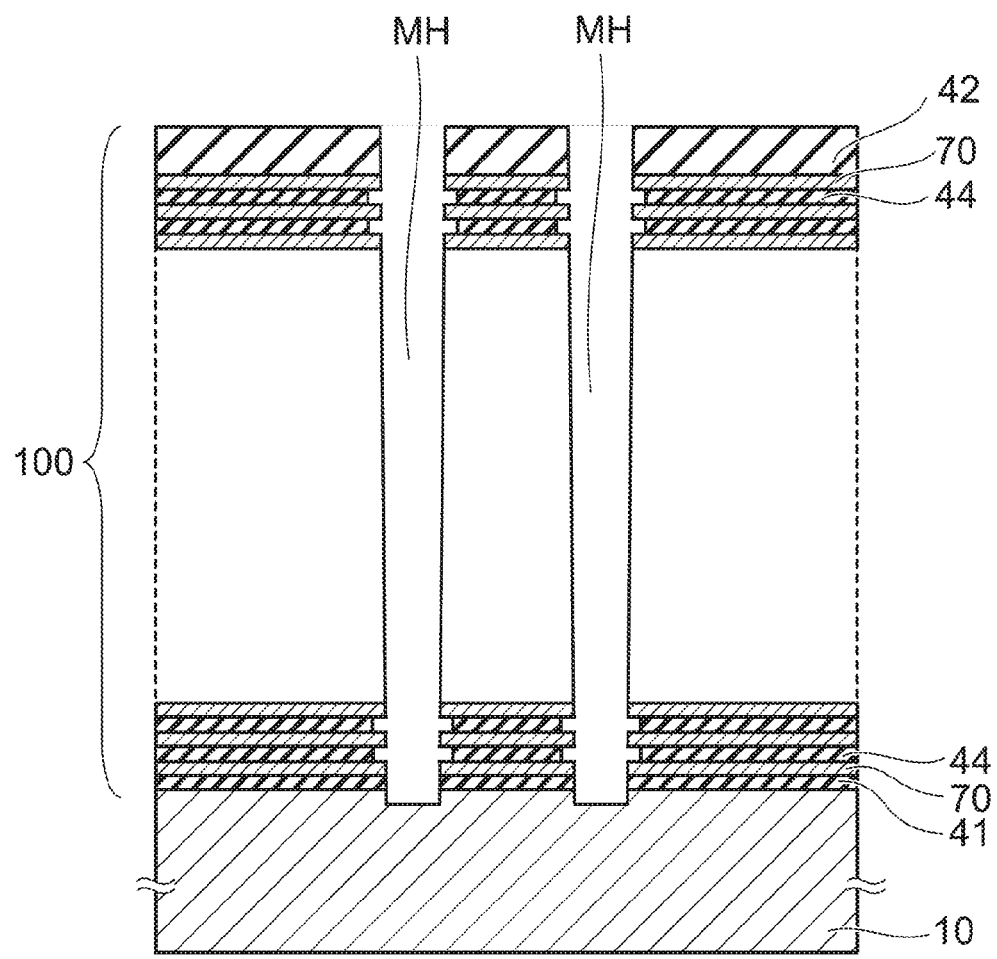
Figure 24C:
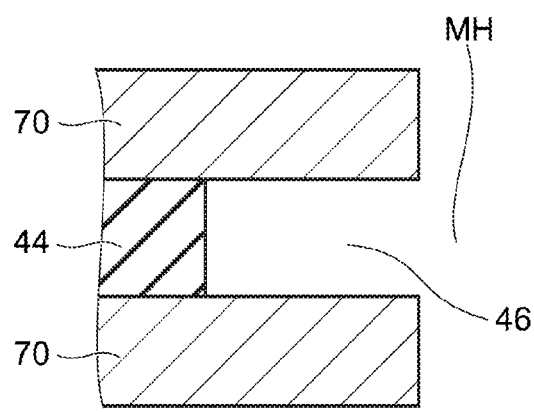

The etching of the sacrificial layer 44 progresses from the side surface of the sacrificial layer 44 exposed in the memory hole MH; and the side surface of the sacrificial layer 44 recedes in the diametral direction of the memory hole MH to be separated from the central axis of the memory hole MH as shown in FIG. 24C and FIG. 15.

By the etching of the sacrificial layer 44, an air gap 46 that communicates with the memory hole MH is made between the electrode layer 70 and the electrode layer 70 adjacent to each other above and below. One portion of the sacrificial layer 44 remains between the electrode layer 70 and the electrode layer 70. The air gap 46 is made between the memory hole MH and one portion of the remaining sacrificial layer 44. The air gap 46 is made in a ring configuration surrounding the periphery of the memory hole MH.

Figure 25A:
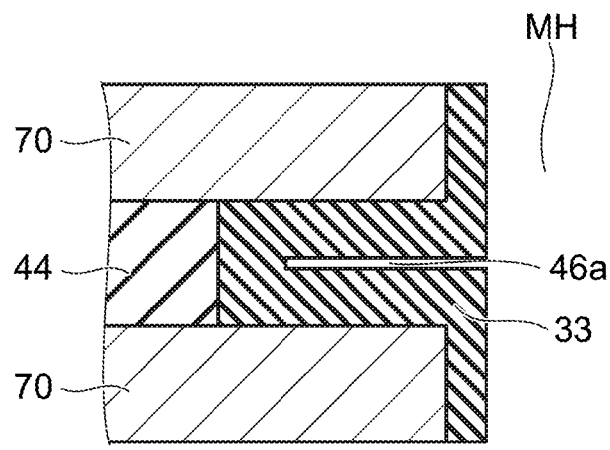

Then, the blocking insulating film 33 shown in FIG. 25A is formed in the air gap 46 by CVD or ALD. The source gas in the film formation is supplied to the air gap 46 through the memory hole MH. The blocking insulating film 33 is formed also on the side surfaces of the electrode layers 70 adjacent to the memory hole MH.

The blocking insulating film 33 is formed conformally along the side surfaces of the electrode layers 70, the surfaces of the electrode layers 70 adjacent to the air gap 46, and the side surface of the sacrificial layer 44 adjacent to the air gap 46.

The film thickness of the blocking insulating film 33 is set to be thinner than ½ of the height (the length in the stacking direction) of the air gap 46. Therefore, one portion 46a of the air gap 46 remains between the blocking insulating film 33 formed on the lower surface of the electrode layer 70 on the upper side and the blocking insulating film 33 formed on the upper surface of the electrode layer 70 on the lower side.

The remaining air gap 46a communicates with the memory hole MH and extends from the memory hole MH toward the sacrificial layer 44.

Figure 25B:
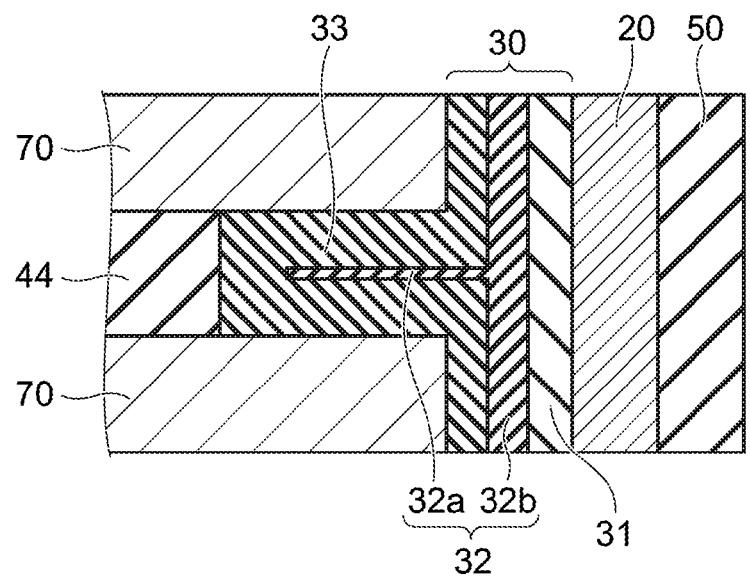

Then, the charge storage film 32 shown in FIG. 25B is formed in the air gap 46a and on the side surface of the blocking insulating film 33 adjacent to the memory hole MH. The charge storage film 32 includes a first portion 32a filled into the air gap 46a, and a second portion 32b extending in the stacking direction of the stacked body 100 and provided on the side surface of the blocking insulating film 33.

The first portion 32a is provided as one body with the second portion 32b and extends from the second portion 32b toward the sacrificial layer 44. The first portion 32a is provided between the blocking insulating film 33 provided on the lower surface of the electrode layer 70 on the upper side and the blocking insulating film 33 provided on the upper surface of the electrode layer 70 on the lower side.

The tunneling insulating film 31 is formed on the side surface of the second portion 32b of the charge storage film 32 adjacent to the memory hole MH. The tunneling insulating film 31 extends continuously in the stacking direction of the stacked body 100.

Thus, the memory film 30 that includes the blocking insulating film 33, the charge storage film 32, and the tunneling insulating film 31 is formed on the side surface of the memory hole MH.

Figure 16:
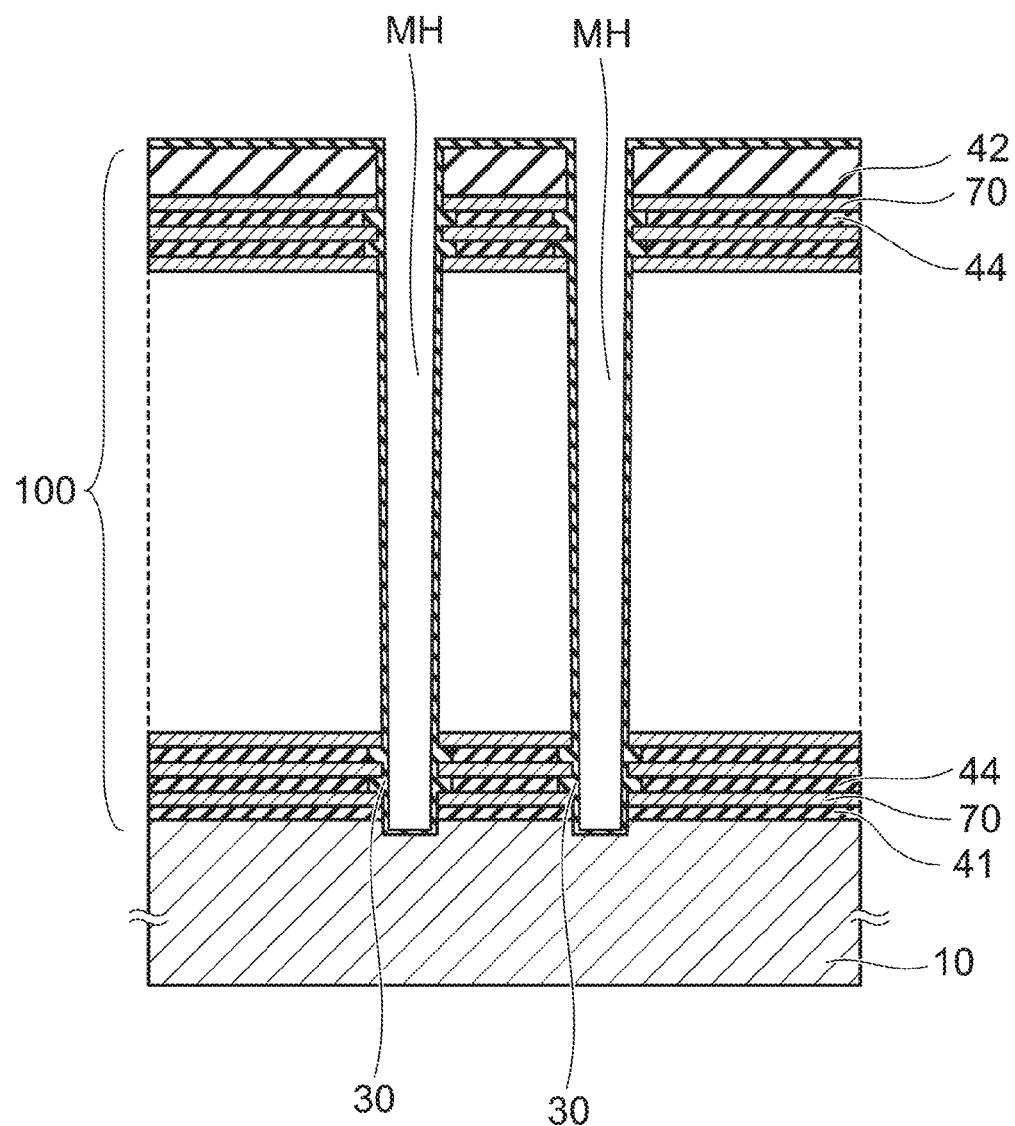
Figure 17:
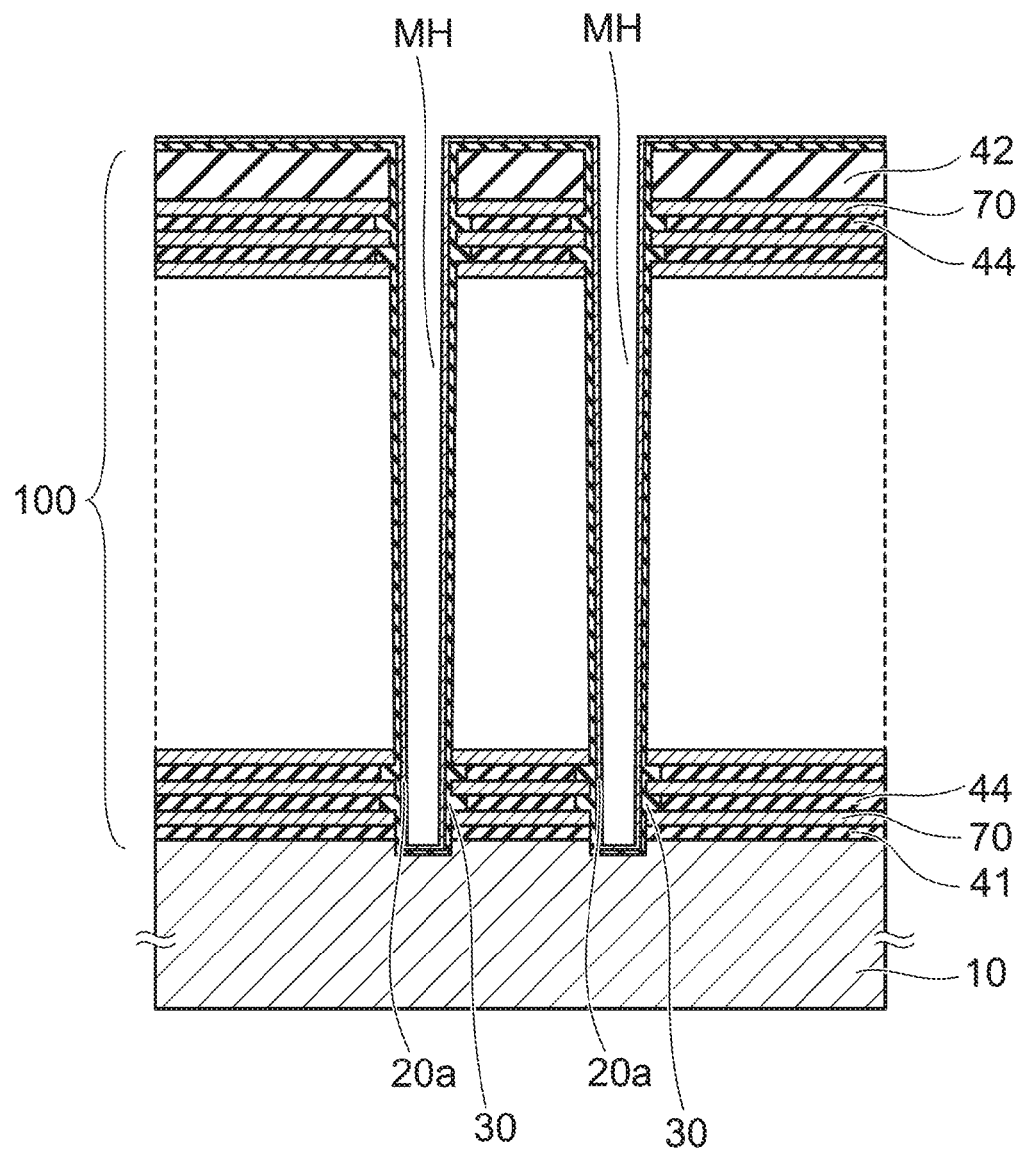

As shown in FIG. 16, the memory film 30 is formed also on the bottoms of the memory holes MH. As shown in FIG. 17, a cover film 20a is formed on the inner side of the memory film 30.

Figure 18:
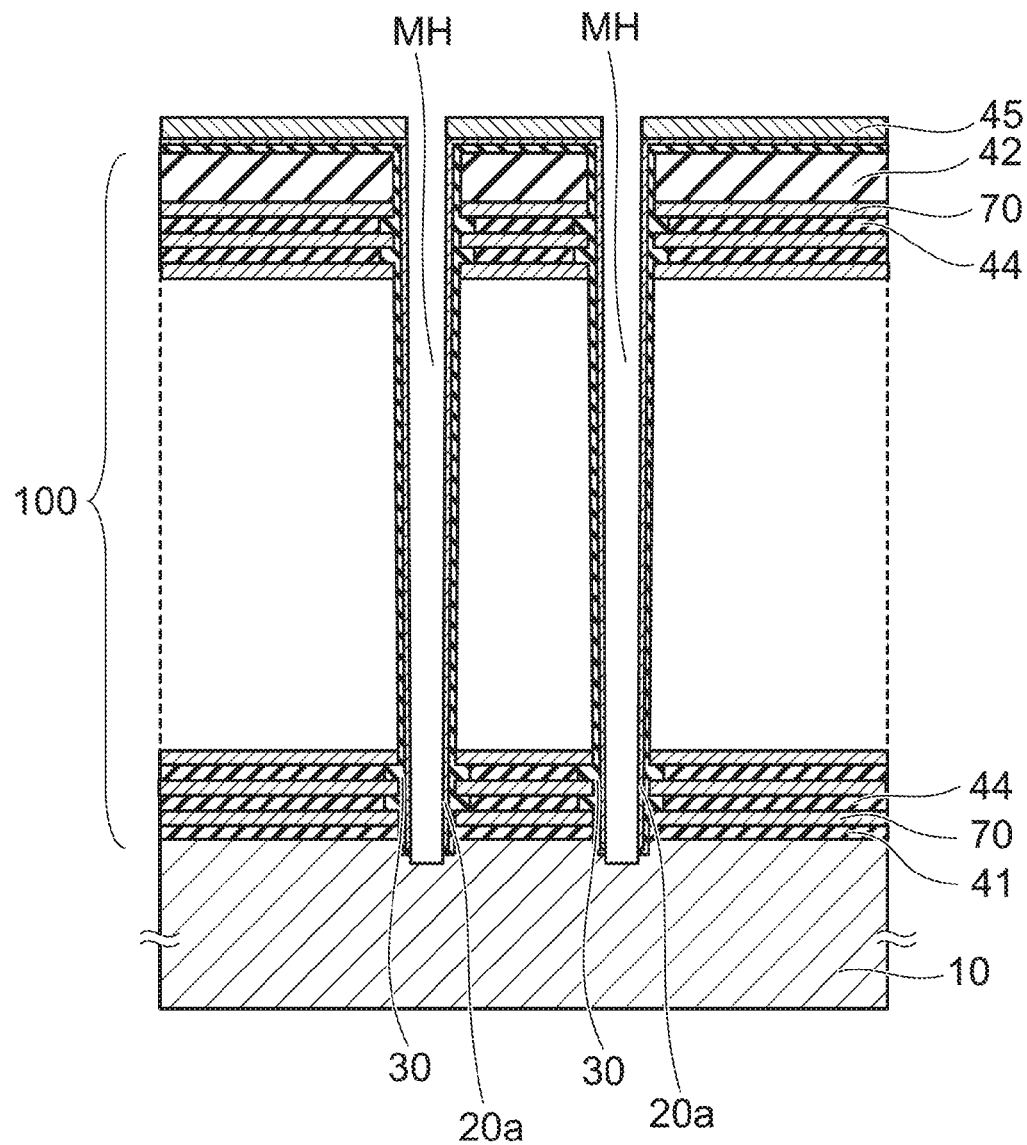

As shown in FIG. 18, a mask layer 45 is formed on the upper surface of the stacked body 100; and the cover film 20a and the memory film 30 that are formed on the bottoms of the memory holes MH are removed by RIE. In the RIE, the memory film 30 formed on the side surfaces of the memory holes MH is covered with and protected by the cover film 20a. Accordingly, the memory film 30 formed on the side surfaces of the memory holes MH is not damaged by the RIE.

Figure 19:
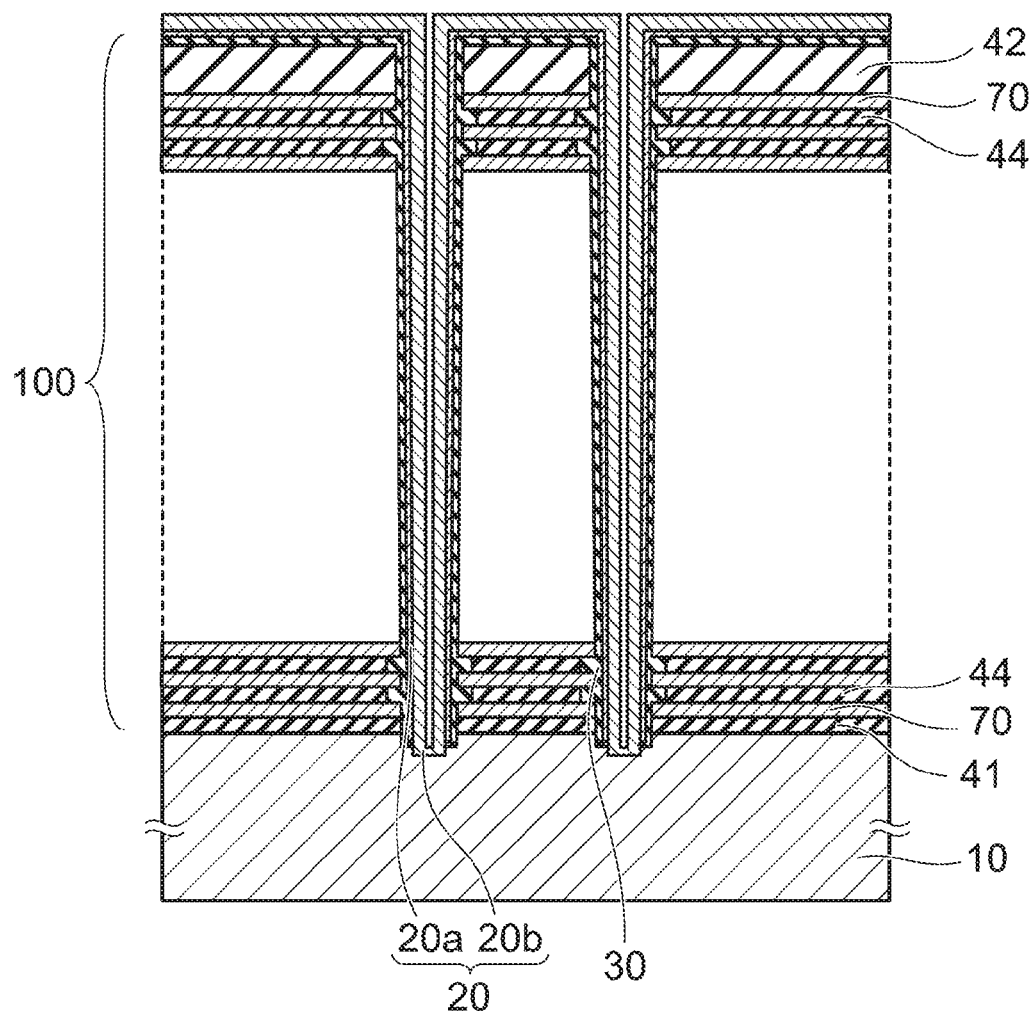

After removing the mask layer 45, a semiconductor film 20b is formed inside the memory holes MH as shown in FIG. 19. The semiconductor film 20b is formed on the side surface of the cover film 20a and the bottoms of the memory holes MH where the substrate 10 is exposed.

For example, the cover film 20a and the semiconductor film 20b are crystallized into polycrystalline silicon films by thermal annealing after being formed as amorphous silicon films. The cover film 20a is included with the semiconductor film 20b in one portion of the semiconductor film 20 described above.

Figure 20:
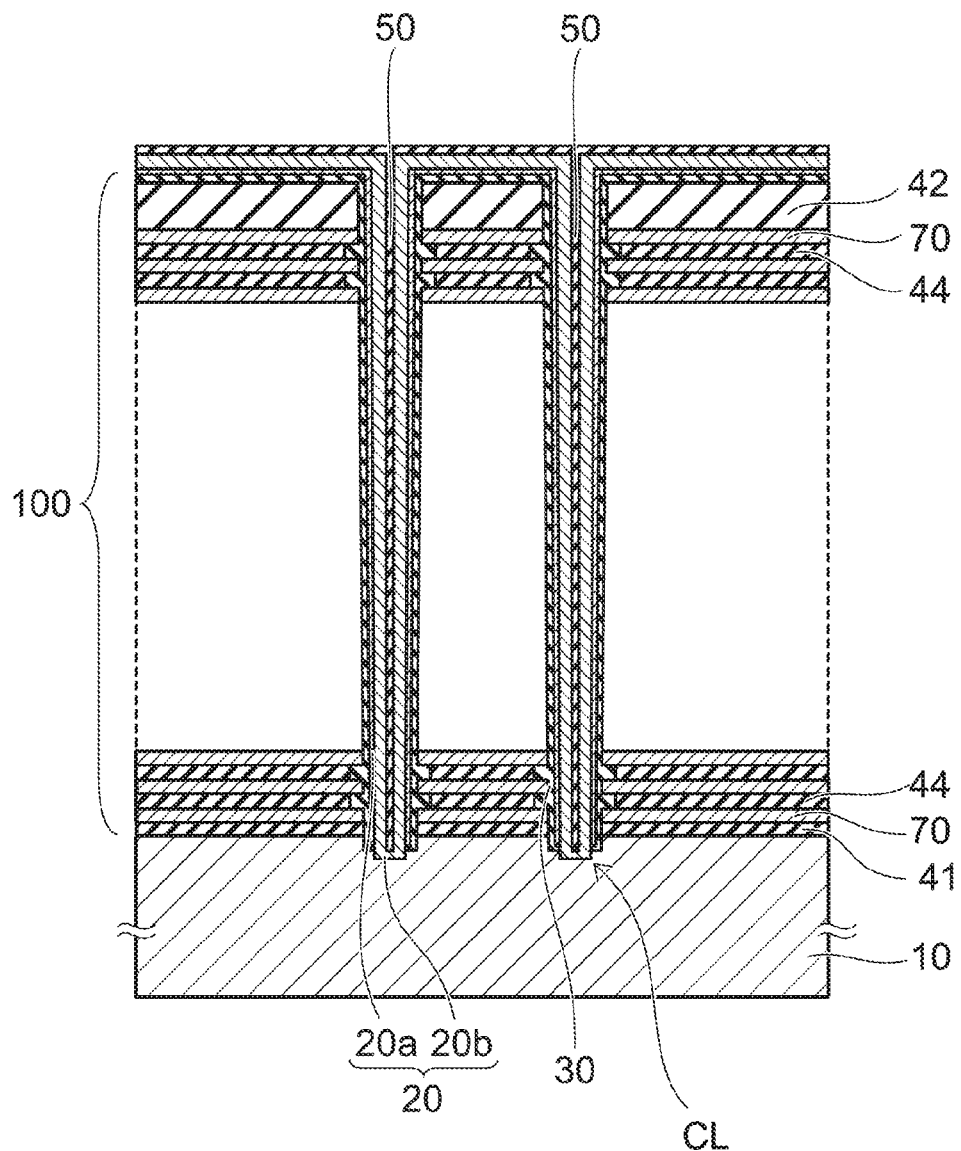

As shown in FIG. 20, the core film 50 is formed on the inner side of the semiconductor film 20b; and the columnar units CL are formed thereby. FIG. 25B corresponds to an enlarged view of one portion of FIG. 20.

Figure 21:
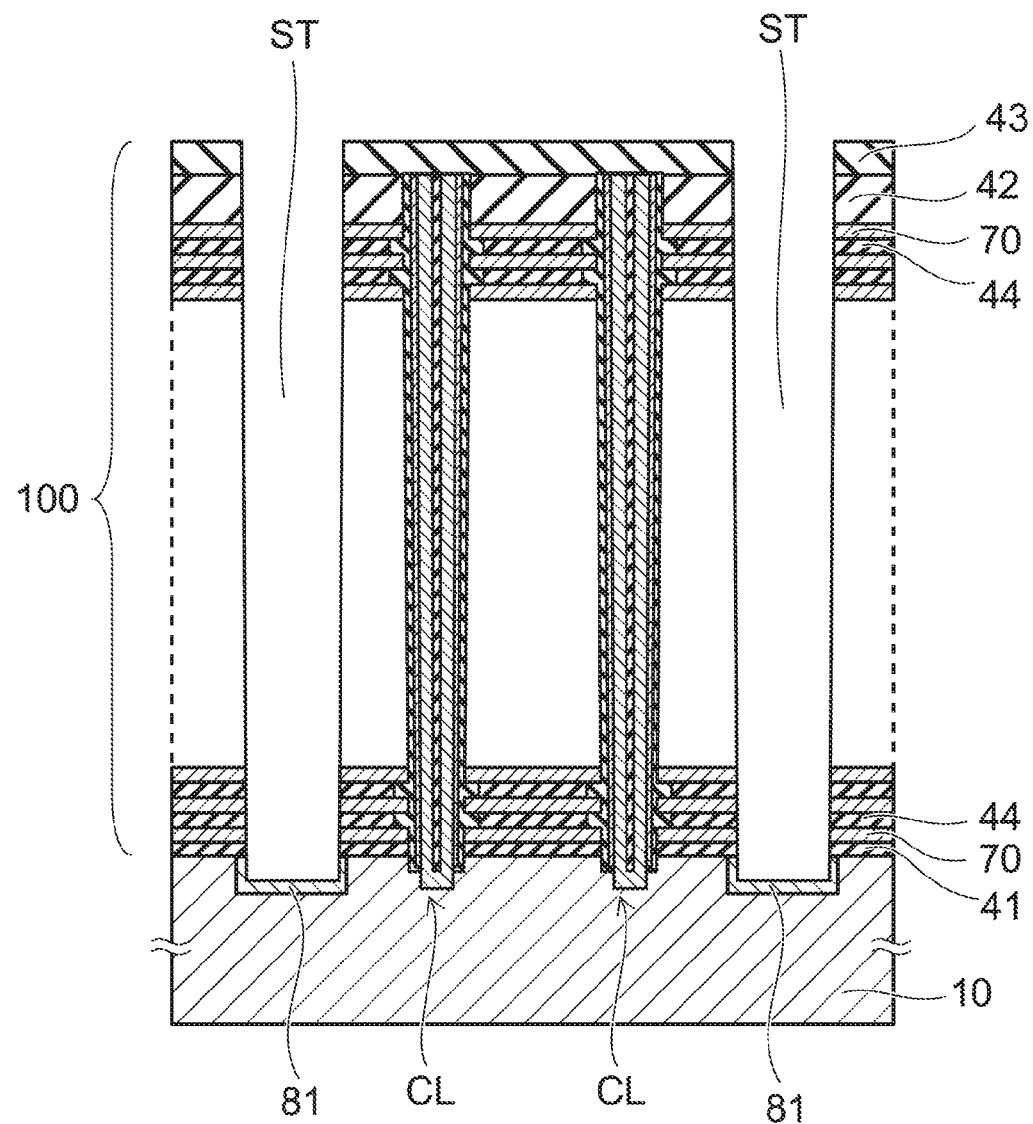

The films deposited on the insulating film 42 shown in FIG. 20 are removed by CMP and etch-back. Subsequently, as shown in FIG. 21, the insulating film 43 is formed on the insulating film 42. The insulating film 43 covers the upper ends of the stacked films included in the columnar units CL.

Then, a plurality of slits ST are made in the stacked body 100 including the insulating films 43 and 42, the electrode layers 70, the sacrificial layers 44, and the insulating film 41 by RIE using a not-shown mask. As shown in FIG. 21, the slits ST extend in the stacking direction of the stacked body 100, pierce the stacked body 100, and reach the substrate 10. Also, the slits ST extend into the page surface (in FIG. 10, the X-direction) and divide the stacked body 100 into a plurality.

Impurities are implanted into the substrate 10 exposed at the bottoms of the slits ST by ion implantation; and the p-type or n-type semiconductor region 81 is formed in the surface of the substrate 10 at the bottoms of the slits ST.

Figure 26A:
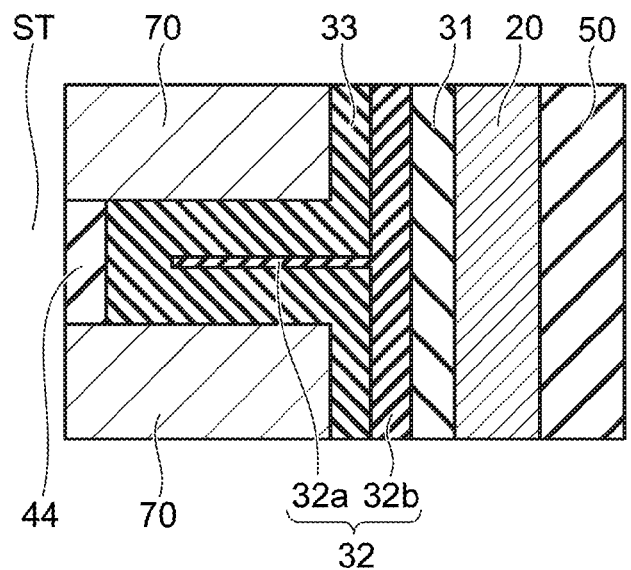

FIG. 26A corresponds to an enlarged view of one portion of FIG. 21. The slit ST is made in the region of the stacked body 100 where the sacrificial layer 44 remains.

The side surfaces of the electrode layers 70 along the slit ST and the side surface of the sacrificial layer 44 along the slit ST are exposed in the slit ST.

Then, the sacrificial layer 44 that remains between the electrode layer 70 and the electrode layer 70 is etched using an etchant or an etching gas supplied to the slit ST. For example, the sacrificial layer 44 which is a silicon oxide film is etched by supplying an etchant containing hydrofluoric acid to the slit ST.

Figure 22:
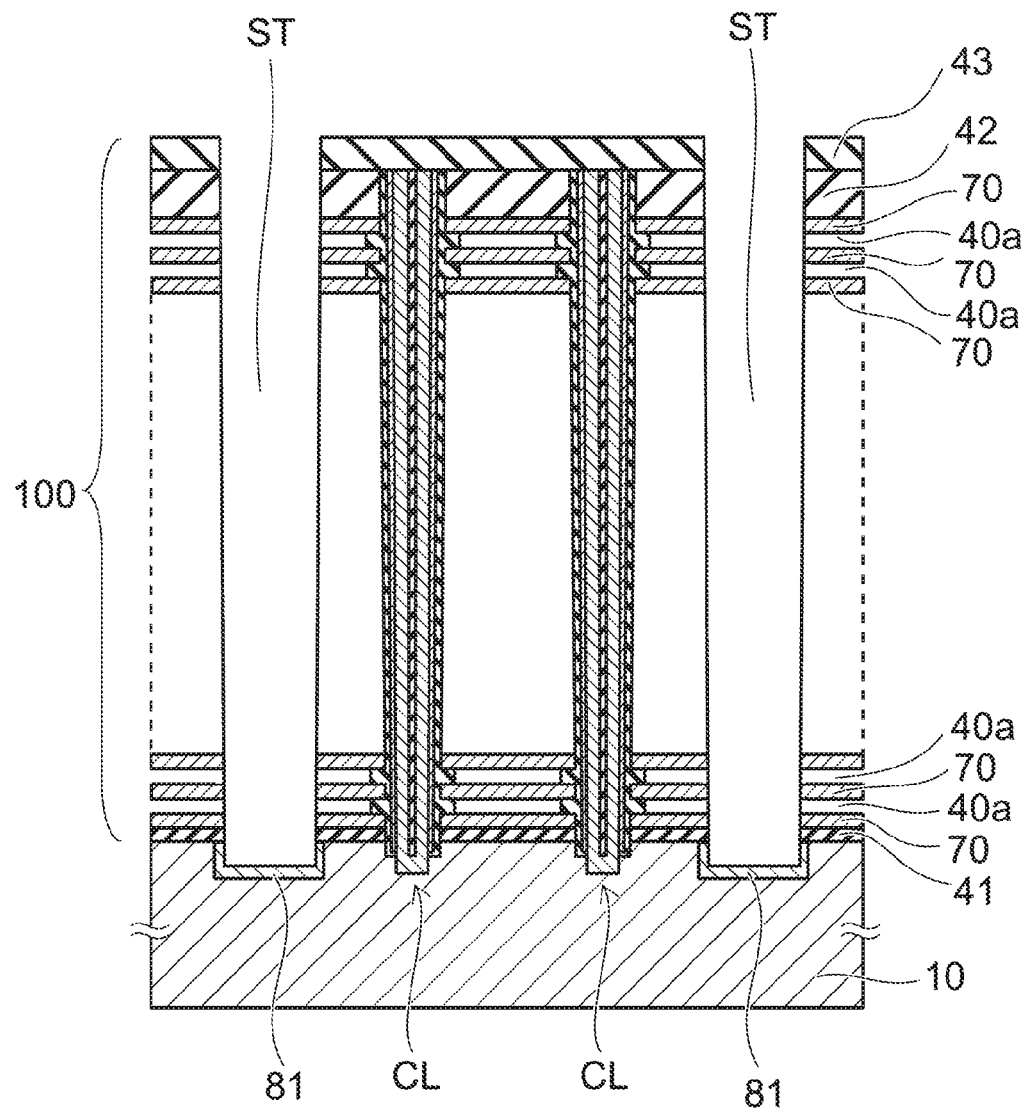
Figure 26B:
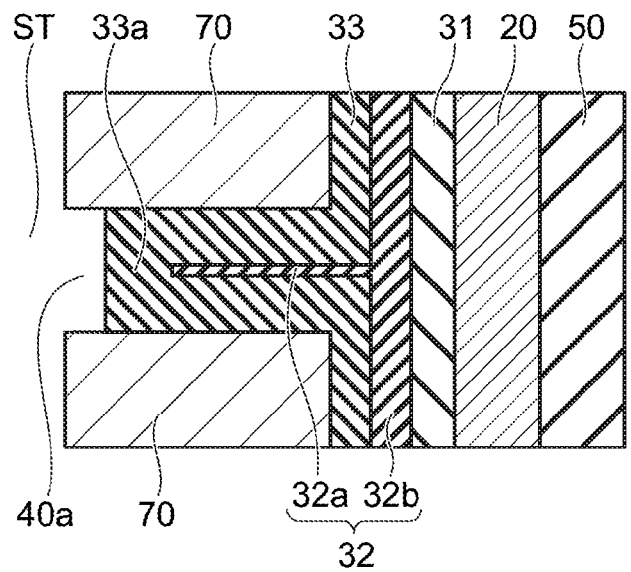

By the etching of the sacrificial layer 44, the air gap 40a that communicates with the slit ST is made between the electrode layers 70 adjacent to each other above and below as shown in FIG. 22 and FIG. 26B.

The etching selectivity of the sacrificial layer 44 with respect to the substrate 10, the insulating films 41, 42, and 43, and the electrode layers 70 shown in FIG. 22 is sufficiently high. The substrate 10, the insulating films 41, 42, and 43, and the electrode layers 70 remain without being etched. Also, because the upper ends of the columnar units CL are covered with the insulating film 43, etching from the upper end side of the columnar units CL also can be suppressed.

The electrode layers 70 that are stacked with the air gap 40a interposed are supported by the columnar unit CL. The lower end of the columnar unit CL is supported by the substrate 10; and the upper end of the columnar unit CL is supported by the insulating films 42 and 43.

As shown in FIG. 26B, an end portion 33a of the blocking insulating film 33 is exposed in the air gap 40a. Etching of the blocking insulating film 33 is caused to progress from the end portion 33a; and the first portion 32a of the charge storage film 32 is exposed as shown in FIG. 27A.

For example, the blocking insulating film 33 which is a silicon oxide film is etched by supplying an etchant containing hydrofluoric acid to the slit ST. For example, the charge storage film 32 which is a silicon nitride film has etching resistance to the etchant containing hydrofluoric acid.

Figure 27A:
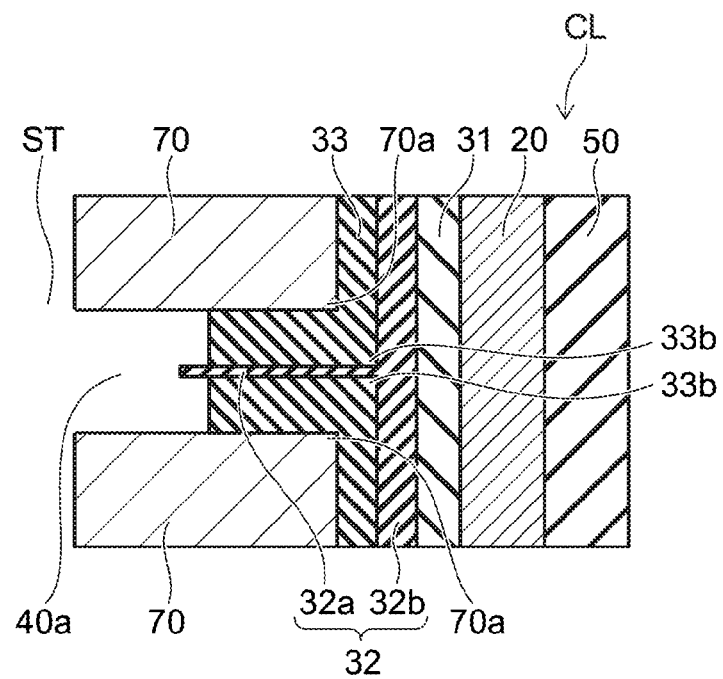

As shown in FIG. 27A, the electrode layer 70 has the corner 70a between the side surface of the electrode layer 70 on the columnar unit CL side and the surfaces of the electrode layer 70 opposing the other electrode layers 70 adjacent above and below. The side surface of the electrode layer 70 is continuous, with the corner 70a interposed, with the surface of the electrode layer 70 opposing the other electrode layer 70.

The blocking insulating film 33 has the corner 33b formed along the corner 70a of the electrode layer 70 and covering the corner 70*a*. The base of the first portion 32*a* of the charge storage film 32 on the second portion 32*b* side is interposed in the vertical direction between the corner 33*b* of the blocking insulating film 33 provided on the lower surface of the electrode layer 70 on the upper side and the corner 33*b* of the blocking insulating film 33 provided on the upper surface of the electrode layer 70 on the lower side. The first portion 32*a* and the second portion 32*b* of the charge storage film 32 are continuous along the corner 33*b* of the blocking insulating film 33 and cover the corner 33*b*.

The etching of the blocking insulating film 33 is stopped at a timing when one portion on the tip side of the first portion 32*a* of the charge storage film 32 is exposed. The corners 33*b* of the blocking insulating films 33 remain at this point in time.

Then, etching of the charge storage film 32 is caused to progress from the exposed first portion 32*a*. For example, the charge storage film 32 which is a silicon nitride film is etched by supplying an etchant containing phosphoric acid to the slit ST. The blocking insulating film 33 and the electrode layer 70 have etching resistance to the etchant containing phosphoric acid.

Figure 27B:
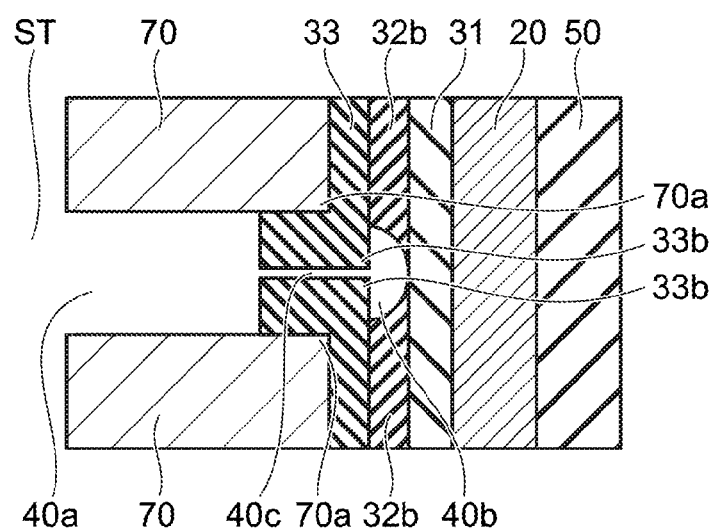

The first portion 32*a* of the charge storage film 32 is etched and removed; and the air gap 40*c* is made between the blocking insulating film 33 formed on the lower surface of the electrode layer 70 on the upper side and the blocking insulating film 33 formed on the upper surface of the electrode layer 70 on the lower side as shown in FIG. 27B.

After the first portion 32*a* is removed, the second portion 32*b* that is formed on the side surface of the blocking insulating film 33 is divided in the stacking direction by causing the etching of the charge storage film 32 to progress further. At this time, the tunneling insulating film 31 functions as an etching stopper; and the etchant does not flow around to the back surface (the surface on the side opposite to the interface with the blocking insulating film 33) side of the second portion 32*b*.

The air gap 40*b* is made in the second portion 32*b* of the charge storage film 32 that was continuous in the stacking direction of the stacked body 100; and the second portion 32*b* is divided in the stacking direction of the stacked body 100 with the air gap 40*b* interposed.

As shown in FIG. 27A, the corner 33*b* of the blocking insulating film 33 covering the corner 70*a* of the electrode layer 70 is separated from the corner 70*a* of the electrode layer 70 by an amount corresponding to the film thickness of the blocking insulating film 33.

After the first portion 32*a* of the charge storage film 32 interposed between the blocking insulating films 33 disappears, etching of the second portion 32*b* progresses isotropically from the corners 33*b* of the blocking insulating films 33 as start points; and the second portion 32*b* is divided in the stacking direction (the vertical direction) of the stacked body 100.

In the second embodiment as well, similarly to the first embodiment, the etching start point of the second portion 32*b* is not proximal to the side surface of the electrode layer 70; and there is a distance from the etching start point to the portion of the second portion 32*b* opposing the side surface of the electrode layer 70. It is desirable for the distance to be not less than the film thickness of the second portion 32*b*.

Therefore, the second portion 32*b* can be divided in the vertical direction before the etching progresses to the portion of the second portion 32*b* opposing the side surface of the electrode layer 70. Or, the etching consumption amount can be suppressed for the portion of the second portion 32*b* opposing the side surface of the electrode layer 70 until the dividing of the second portion 32*b* in the vertical direction ends. The charge storage film 32 can be divided in the vertical direction while causing a sufficient amount of the charge storage film 32 to remain at the portion opposing the side surface of the electrode layer 70.

By etching the end portion 33*a* of the blocking insulating film 33 covering the tip portion of the first portion 32*a* of the charge storage film 32 in FIG. 26B, the blocking insulating film 33 also is divided in the stacking direction (the vertical direction) of the stacked body 100 as shown in FIG. 27A. Further, by the first portion 32*a* disappearing, the air gap 40*c* is made as shown in FIG. 27B between the blocking insulating films 33 adjacent to each other in the vertical direction.

Even after the etching to divide the second portion 32*b* of the charge storage film 32 has ended, the corners 33*b* of the blocking insulating films 33 and the portions of the blocking insulating films 33 extending along the side surfaces of the electrode layers 70 from the corners 33*b* remain as shown in FIG. 27B. The corners 33*b* of the blocking insulating films 33 are adjacent to the air gap 40*b* between the multiple second portions 32*b* that are separated.

Accordingly, the etching of the second portion 32*b* of the charge storage film 32 can be prevented from progressing from portions other than the portions proximal to the corner 33*b* of the blocking insulating film 33. The charge storage film 32 can be caused to remain reliably at the portion opposing the side surface of the electrode layer 70.

Figure 28A:
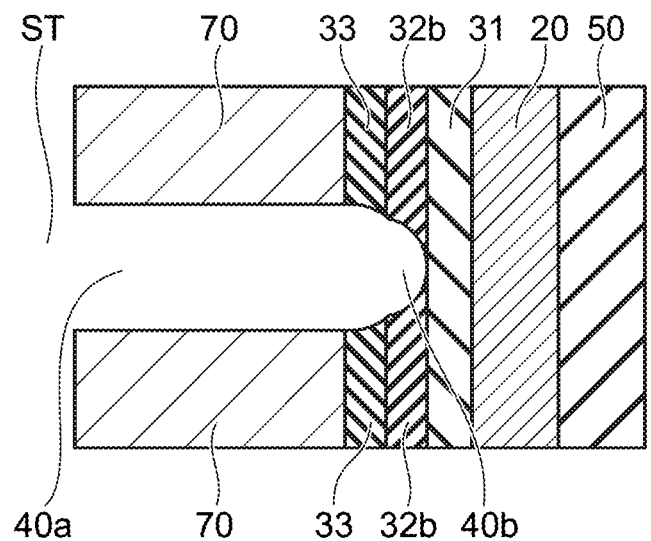

The corner 33*b* of the blocking insulating film 33 and the portion of the blocking insulating film 33 extending from the corner 33*b* toward the air gap 40*a* may be removed as shown in FIG. 28A. For example, the portion of the blocking insulating film 33 recited above can be removed by an etchant or an etching gas supplied to the air gap 40*a* through the slit ST.

Figure 28B:
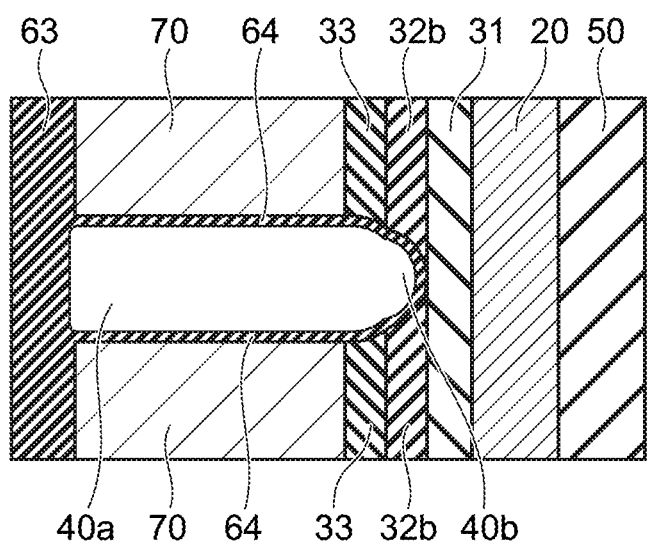

Subsequently, as shown in FIG. 28B, a protective film 64 may be formed on the surfaces of the electrode layers 70 exposed in the air gap 40*a*. For example, when forming the insulating film 63 described below on the side surface of the slit ST, one portion of the insulating film 63 can be formed on the surfaces of the electrode layers 70 as the protective film 64.

Figure 23:
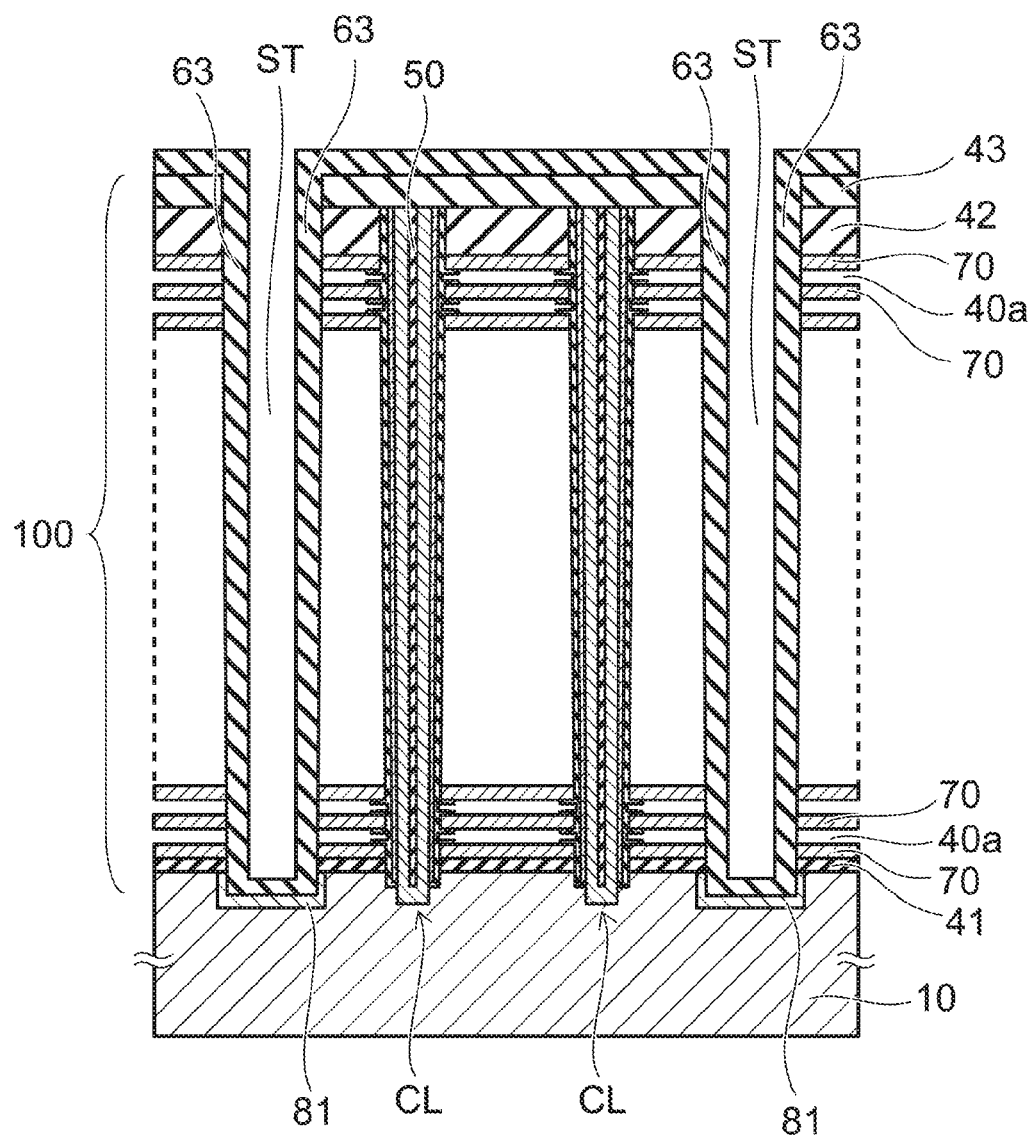

The insulating film 63 is formed on the side surface and bottom of the slit ST as shown in FIG. 23. The insulating film 63 that has poor coverage plugs the opening of the air gap 40*a* on the slit ST side. The interior of the air gap 40*a* is not filled with the insulating film 63.

After removing the insulating film 63 formed on the bottom of the slit ST by RIE, the interconnect unit LI is filled into the slit ST as shown in FIG. 11. The lower end of the interconnect unit LI is connected to the substrate 10 via the semiconductor region 81. Subsequently, the bit lines BL, the source line SL, etc., shown in FIG. 10 are formed.

The processes shown in FIG. 5A to FIG. 8 described in the first embodiment described above also are applicable to the method for manufacturing the semiconductor device of the second embodiment.

In FIG. 8, the first layer 171 and the second layer 172 can correspond to electrode layers, the first film 133 can correspond to a blocking insulating film, the second film 132 can correspond to a charge storage film, and the third film 131 can correspond to a tunneling insulating film.

FIG. 35A to FIG. 38B are schematic cross-sectional views of a method for manufacturing a semiconductor device of a reference example.

Figure 35A:
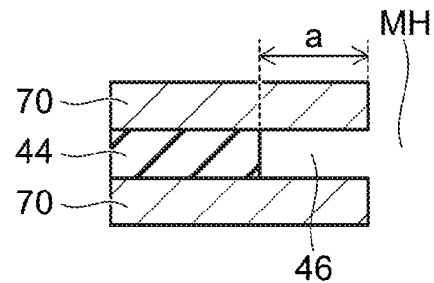
Figure 35B:
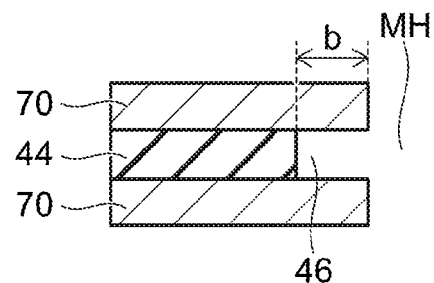

FIG. 35A and FIG. 35B correspond to the process shown in FIG. 24C.

Figure 36A:
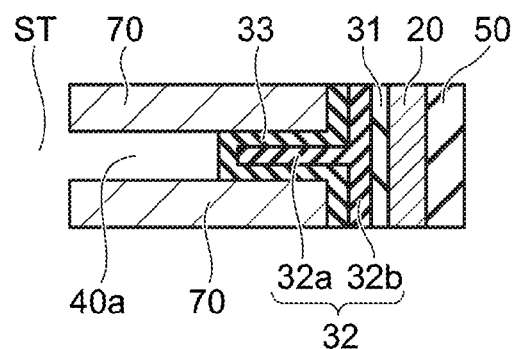
Figure 36B:
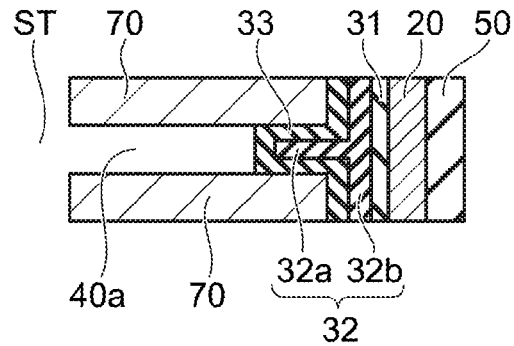

FIG. 36A and FIG. 36B correspond to the process shown in FIG. 26B.

Figure 37A:
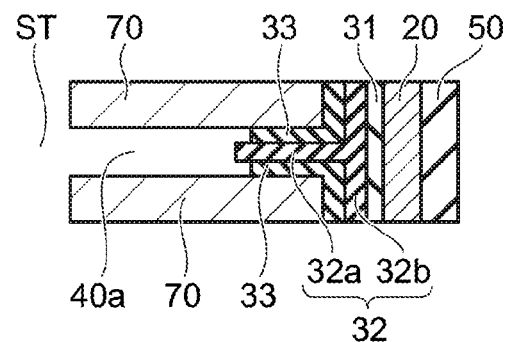
Figure 37B:
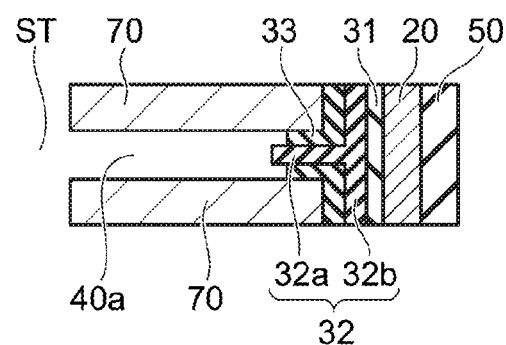

FIG. 37A and FIG. 37B correspond to the process shown in FIG. 27A.

Figure 38A:
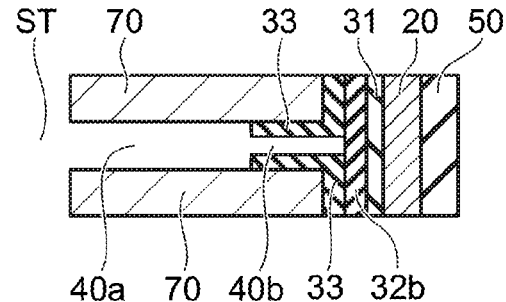
Figure 38B:
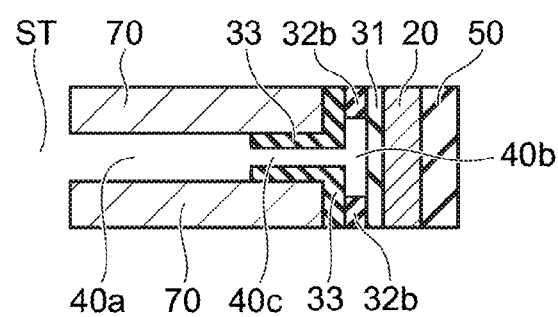

FIG. 38A and FIG. 38B correspond to the process shown in FIG. 27B.

The electrode layers 70 shown in FIG. 35A, FIG. 36A, FIG. 37A, and FIG. 38A are provided on the upper layer side of the electrode layers 70 shown in FIG. 35B, FIG. 36B, FIG. 37B, and FIG. 38B. For example, FIG. 35A, FIG. 36A, FIG. 37A, and FIG. 38A show one portion of the stacked body 100 on the top side of the memory hole MH; and FIG. 35B, FIG. 36B, FIG. 37B, and FIG. 38B show one portion of the stacked body 100 on the bottom side of the memory hole MH.

One portion of the sacrificial layer 44 is removed as shown in FIG. 35A and FIG. 35B by an etchant or an etching gas supplied from the memory hole MH; and the air gap 46 that communicates with the memory hole MH is made between the electrode layers 70.

In particular, the amount of the etchant or the etching gas supplied to the bottom side of the memory hole MH easily becomes less than the amount of the etchant or the etching gas supplied to the top side of the memory hole MH as the aspect ratio of the memory hole MH becomes high. Also, the time that the sacrificial layer 44 on the bottom side of the memory hole MH is exposed to the etchant or the etching gas easily becomes shorter than the time that the sacrificial layer 44 on the top side of the memory hole MH is exposed to the etchant or the etching gas.

Therefore, the receded amount from the side surface of the memory hole MH of the sacrificial layer 44 on the bottom side of the memory hole MH becomes less than the receded amount from the side surface of the memory hole MH of the sacrificial layer 44 on the top side of the memory hole MH; and a width b of the air gap 46 on the bottom side shown in FIG. 35B easily becomes narrower than a width a of the air gap 46 on the top side shown in FIG. 35A.

The blocking insulating film 33 and the first portion 32a of the charge storage film 32 are formed in the air gap 46 as shown in FIG. 36A and FIG. 36B. Further, the tunneling insulating film 31, the semiconductor film 20, and the core film 50 are formed. Subsequently, the slit ST is made. Then, the air gap 40a is made by removing the sacrificial layer 44 remaining between the electrode layers 70 through the slit ST.

Subsequently, as shown in FIG. 37A and FIG. 37B, the blocking insulating film 33 is etched; and one portion of the first portion 32a of the charge storage film 32 is exposed. Then, etching of the charge storage film 32 is caused to progress from the exposed portion.

Here, due to the difference between the width a of the air gap 46 of FIG. 35A and the width b of the air gap 46 of FIG. 35B, the protruding length of the first portion 32a from the second portion 32b shown in FIG. 37B is shorter than the protruding length of the first portion 32a from the second portion 32b shown in FIG. 37A.

Therefore, a difference of the disappearance time due to the etching of the first portion 32a occurs between the top side and the bottom side of the memory hole MH. The first portion 32a on the bottom side of the memory hole MH disappears earlier than the first portion 32a on the top side; and by this amount, the second portion 32b on the bottom side of the memory hole MH starts to be etched earlier than the second portion 32b on the top side.

For example, there may be cases where the second portion 32b cannot yet be divided on the top side shown in FIG. 38A at the point in time when the second portion 32b on the bottom side shown in FIG. 38B is divided in the vertical direction. Subsequently, as the etching continues further to divide the second portion 32b on the top side, the recession in the vertical direction of the second portion 32b on the bottom side progresses further; and the amount of the second portion 32b at the portion opposing the side surface of the electrode layer 70 may undesirably decrease or disappear.

Therefore, according to the method of the embodiment shown in FIG. 29A to FIG. 33B described below, the charge storage film 32 can be caused to remain reliably on the side surface of the electrode layer 70 even in the case where the receded amount of the sacrificial layer 44 from the memory hole MH fluctuates between the stacking positions of the sacrificial layer 44.

The electrode layers 70 shown in FIG. 29A, FIG. 30A, FIG. 31A, FIG. 32A, and FIG. 33A are provided on the upper layer side of the electrode layers 70 shown in FIG. 29B, FIG. 30B, FIG. 31B, FIG. 32B, and FIG. 33B. For example, FIG. 29A, FIG. 30A, FIG. 31A, FIG. 32A, and FIG. 32A show one portion of the stacked body 100 on the top side of the memory hole MH; and FIG. 29B, FIG. 30B, FIG. 31B, FIG. 32B, and FIG. 33B show one portion of the stacked body 100 on the bottom side of the memory hole MH.

Figure 29A:
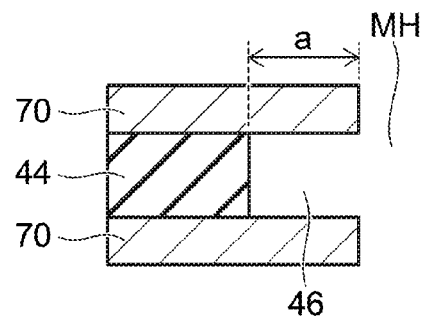
Figure 29B:
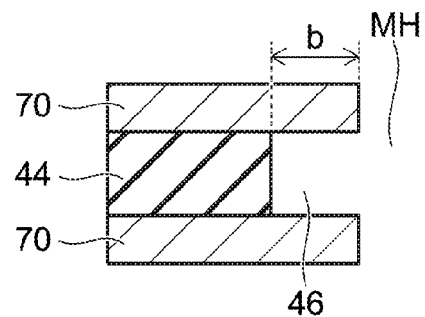

The air gap 46 that communicates with the memory hole MH is made between the electrode layers 70 by one portion of the sacrificial layer 44 being removed as shown in FIG. 29A and FIG. 29B by an etchant or an etching gas supplied from the memory hole MH.

The receded amount from the side surface of the memory hole MH of the sacrificial layer 44 on the bottom side of the memory hole MH is less than the receded amount from the side surface of the memory hole MH of the sacrificial layer 44 on the top side of the memory hole MH; and the width b of the air gap 46 on the bottom side shown in FIG. 29B is narrower than the width a of the air gap 46 on the top side shown in FIG. 29A.

Figure 30A:
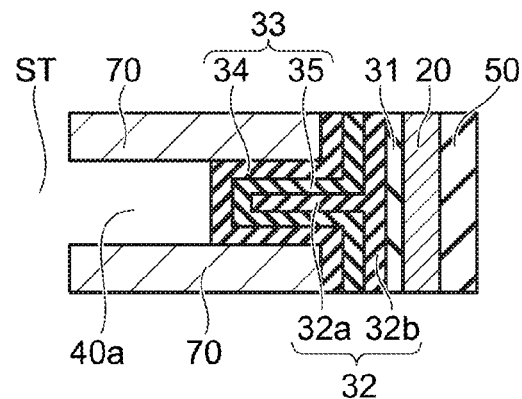
Figure 30B:
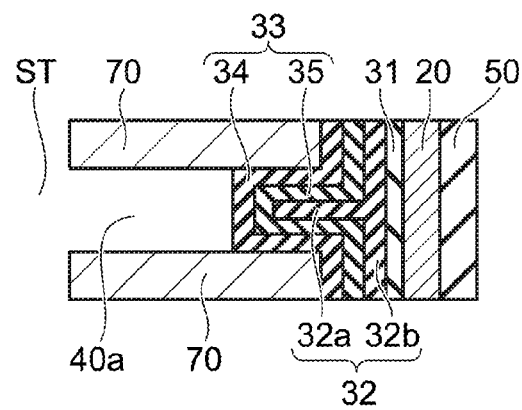

As shown in FIG. 30A and FIG. 30B, the blocking insulating film 33 and the first portion 32a of the charge storage film 32 are formed in the air gap 46. Further, the tunneling insulating film 31, the semiconductor film 20, and the core film 50 are formed. Subsequently, the slit ST is made. Then, the air gap 40a is made by removing the sacrificial layer 44 remaining between the electrode layers 70 through the slit ST.

Here, the blocking insulating film 33 is a stacked film of a first blocking film 34 and a second blocking film 35. First, the first blocking film 34 is formed conformally on the side surface of the electrode layer 70 and the inner surface of the air gap 46; and the second blocking film 35 is formed conformally on the inner side of the first blocking film 34. An air gap that extends from the memory hole MH to the sacrificial layer 44 side remains on the inner side of the second blocking film 35; and the first portion 32a of the charge storage film 32 is filled into the air gap. The second portion 32b of the charge storage film 32 is formed on the side surface of the second blocking film 35.

The first blocking film 34 and the second blocking film 35 are films of different types of materials; for example, the first blocking film 34 is a metal oxide film; and the second blocking film 35 is a silicon oxide film. For example, the blocking property of the electrons can be higher for such a blocking insulating film 33 which is a stacked film than for the blocking insulating film 33 which is a single-layer silicon oxide film.

Figure 31A:
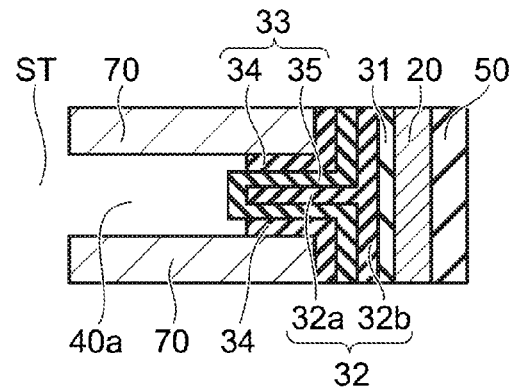
Figure 31B:
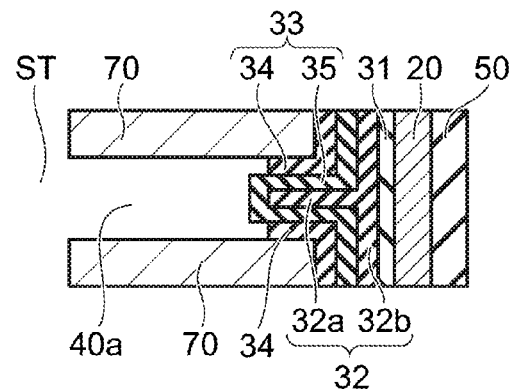

Subsequently, as shown in FIG. 31A and FIG. 31B, one portion of the second blocking film 35 is exposed by etching the first blocking film 34. The first blocking film 34 is divided in the vertical direction. At this time, the first blocking film 34 has high etching selectivity with respect to the electrode layer 70 and the second blocking film 35.

Figure 32A:
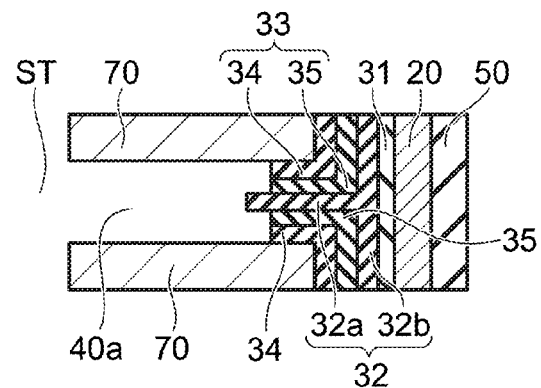
Figure 32B:
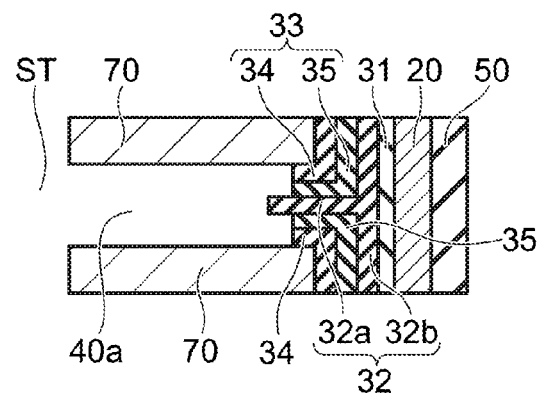

Subsequently, as shown in FIG. 32A and FIG. 32B, one portion of the first portion 32*a* of the charge storage film 32 is exposed by etching the second blocking film 35. The second blocking film 35 is divided in the vertical direction. At this time, the second blocking film 35 has high etching selectivity with respect to the electrode layers 70 and the charge storage film 32. Then, etching of the charge storage film 32 is caused to progress from the exposed portion of the first portion 32*a*.

Here, due to the difference between the width a of the air gap 46 of FIG. 29A and the width b of the air gap 46 of FIG. 29B, the protruding length of the first portion 32*a* from the second portion 32*b* shown in FIG. 32B is shorter than the protruding length of the first portion 32*a* from the second portion 32*b* shown in FIG. 32A.

Therefore, a difference of the disappearance time due to the etching of the first portion 32*a* occurs between the top side and the bottom side of the memory hole MH. The first portion 32*a* on the bottom side of the memory hole MH disappears earlier than the first portion 32*a* on the top side; and by this amount, the second portion 32*b* on the bottom side of the memory hole MH starts to be etched earlier than the second portion 32*b* on the top side.

Figure 33A:
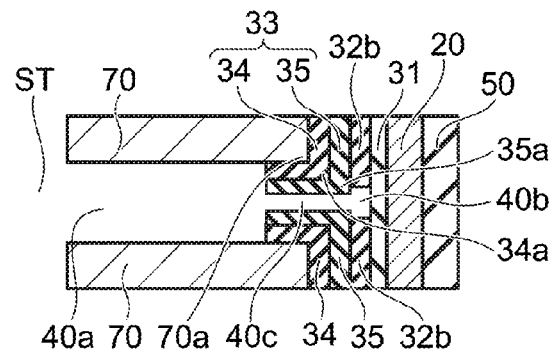
Figure 33B:
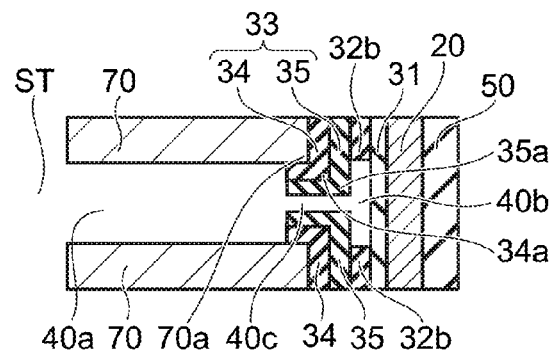

Etching of the second portion 32*b* progresses isotropically from the corners 35*a* of the second blocking films 35 as start points; and the second portion 32*b* is divided in the vertical direction as shown in FIG. 33A and FIG. 33B.

According to the example shown in FIG. 29A to FIG. 33B, the blocking insulating film 33 that is not a single layer but is two layers is interposed between the electrode layer 70 and the charge storage film 32. Therefore, the corner 35*a* of the second blocking film 35 is more distal to the corner 70*a* of the electrode layer 70 than is a corner 34*a* of the first blocking film 34. In other words, the etching start point of the second portion 32*b* can be set to be separated from the corner 70*a* of the electrode layer 70. The distance that the second portion 32*b* recedes from the etching start point to the portion opposing the side surface of the electrode layer 70 can be lengthened.

Accordingly, even in the case where the etching of the second portion 32*b* starts earlier on the bottom side shown in FIG. 33B than on the top side shown in FIG. 33A, a sufficient amount of the second portion 32*b* can remain at the portion opposing the side surface of the electrode layer 70 on the bottom side when the second portion 32*b* on the top side is divided in the vertical direction.

At this time, the height (the length in the vertical direction) of the air gap 40*b* dividing the second portion 32*b* in the vertical direction on the bottom side is larger than the height (the length in the vertical direction) of the air gap 40*b* dividing the second portion 32*b* in the vertical direction on the top side.

In the example shown in FIG. 24A to FIG. 28B recited above, the blocking insulating film 33 corresponds to the first insulating film; the charge storage film 32 corresponds to the second insulating film; and the tunneling insulating film 31 corresponds to the third insulating film.

However, the film 33 used as the first insulating film may be a film including a charge storage film. The film 33 can be a stacked film including two types of films as shown in FIG. 30A to FIG. 33B. For example, the film 33 used as the first insulating film can be a stacked film of a blocking insulating film and a charge storage film. Because the film 33 also is divided in the vertical direction, the movement in the vertical direction of the charge stored in the charge storage film can be prevented even in the case where the film 33 is the film including the charge storage film.

Also, the film 32 used as the second insulating film may be a tunneling insulating film; and the semiconductor film 20 may be formed without the film 31 used as the third insulating film being interposed at the side surface of the film 32. Or, the tunneling insulating film may be a stacked film including the film 32 and the film 31.

Next, a method for forming a memory cell array of a semiconductor device of a third embodiment will now be described with reference to FIG. 39A to FIG. 45.

FIGS. 39A to 45 are schematic cross-sectional views showing a portion of the stacked body 100 on the substrate 10.

A first material layer 71 and a second material layer 44 are stacked alternately on the substrate 10. The processes of alternately stacking the first material layer 71 and the second material layer 44 are repeated, and a plurality of first material layers 71 and a plurality of second material layers 44 are formed on the substrate 10.

The first material layer 71 is, for example, a silicon nitride layer.

The second material layer 44 is, for example, a boron-silicate glass (BSG) layer which is a silicon oxide layer doped with boron.

Figure 39A:
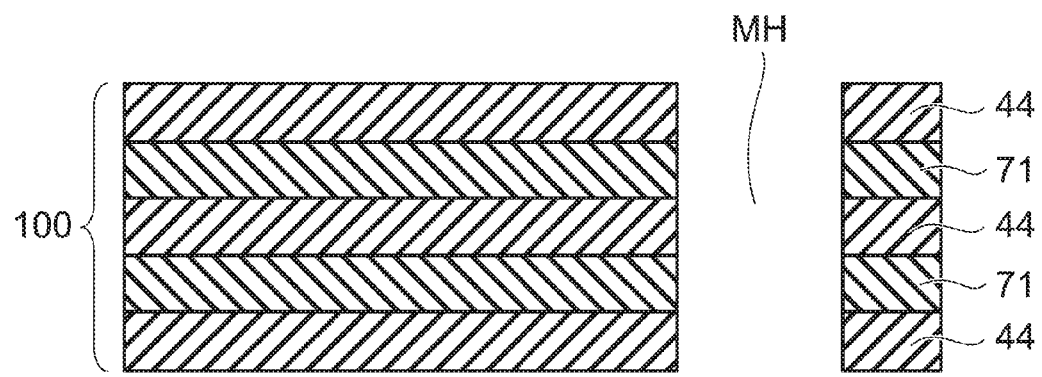
FIGS. 39A to 45 are schematic cross-sectional views showing a method for manufacturing a semiconductor device of a third embodiment.

The memory hole MH is made in the stacked body 100 including the plurality of first material layers 71 and the plurality of second material layers 44, as shown in FIG. 39A. The memory hole MH is made, for example, by RIE using a not-shown mask including a carbon layer, and a CF based gas. The memory hole MH pierces the plurality of first material layers 71 and the plurality of second material layers 44.

After making the memory hole MH, the second material layer 44 which is a BSG layer is etched using an etchant, for example, containing dilute hydrofluoric acid supplied to the memory hole MH.

Figure 39B:
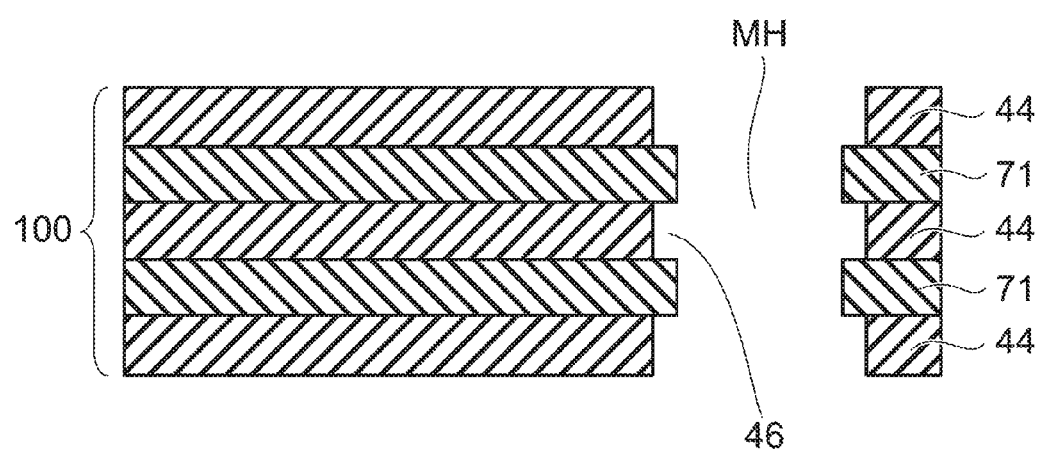

A side etching of the second material layer 44 progresses from a side surface of the second material layer 44 exposed in the memory hole MH; and the side surface of the second material layer 44 recedes in the diametral direction of the memory hole MH to be separated from the central axis of the memory hole MH as shown in FIG. 39B.

By the etching of the second material layer 44, a gap 46 that communicates with the memory hole MH is made between memory hole MH side ends of first material layers 71 adjacent to each other above and below. One portion of the second material layer 44 remains between the first material layer 71 and the first material layer 71. The gap 46 is made in a ring configuration surrounding the periphery of the memory hole MH.

Figure 40A:
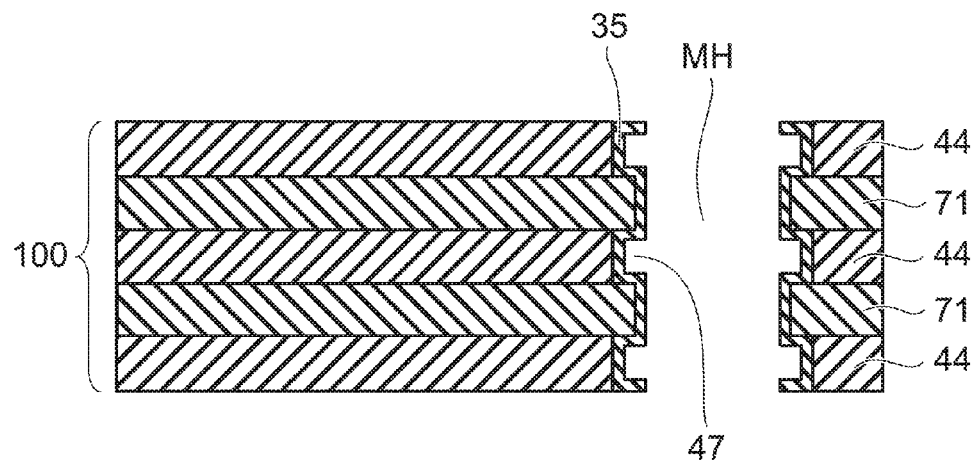

Then, the second blocking film 35 shown in FIG. 40A is formed in the gap 46 by, for example, ALD. The second blocking film 35 is, for example, a silicon oxide film containing $SiO_2$ as a major component.

The second blocking film 35 is formed also on the side surfaces of the first material layers 71 exposed in the memory hole MH. The second blocking film 35 is formed conformally along the side surfaces of the first material layers 71, surfaces of the first material layers 71 exposed in the gap 46, and the side surfaces of the second material layers 44 exposed in the gap 46.

The second blocking film 35 is formed along a stepped portion between the side surface of the first material layer 71 and the side surface of the second material layer 44.

The film thickness of the second blocking film 35 is set to be thinner than ½ of the height of the gap 46. Therefore, a gap 47 remains between the second blocking film 35 formed on the lower surface of the first material layer 71 on the upper side and the second blocking film 35 formed on the upper surface of the first material layer 71 on the lower side, as shown in FIG. 40A. The gap 47 communicates with the memory hole MH and extends in a protruding configuration from the memory hole MH towards the second material layer 44.

Figure 40B:
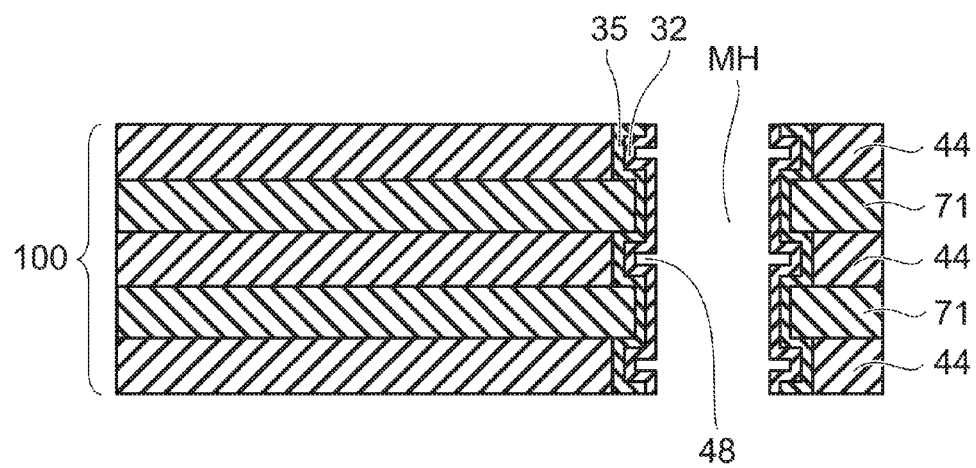

Then, the charge storage film 32 shown in FIG. 40B is formed on the side surface of the second blocking film 35 exposed in the memory hole MH and in the gaps 47 by, for example, ALD. The charge storage film 32 is, for example, a silicon nitride film.

The second blocking film 35 has a stepped portion that reflects the stepped portion between the side surface of the first material layer 71 and the side surface of the second material layer 44. The charge storage film 32 is formed along the stepped portion of the second blocking film 35 continuously in the stacking direction of the stacked body 100.

The film thickness of the charge storage films 32 is set to be thinner than ½ of the height of the gap 47. Therefore, as shown in FIG. 40B, a gap 48 remains memory at a hole MH side of the charge storage film 32 that enters into a portion opposing to the side surface of the second material layer 44. The gap 48 communicates with the memory hole MH and extends in a protruding configuration from the memory hole MH towards the second material layer 44.

Figure 41A:
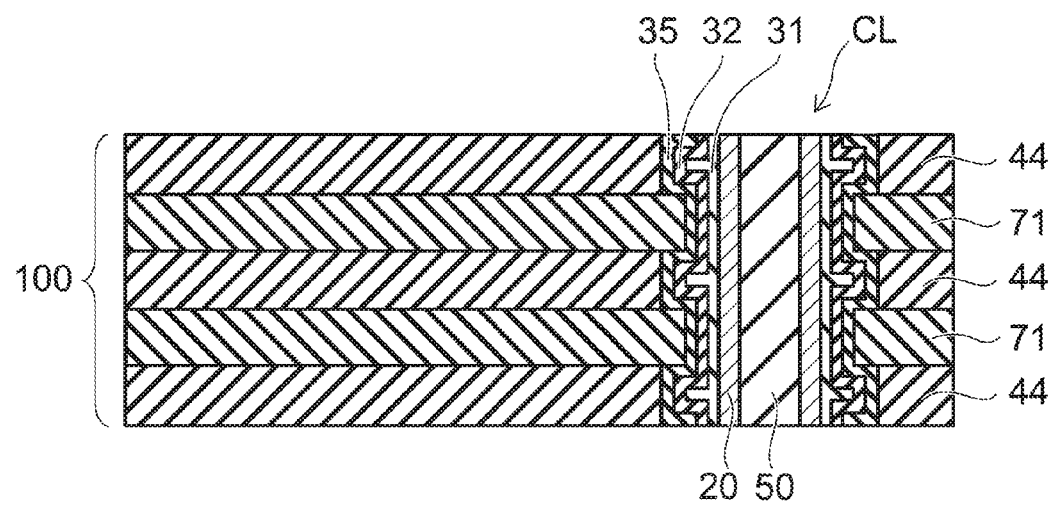

Then, the tunneling insulating film 31 shown in FIG. 41A is formed on the side surface of the charge storage film 32 exposed in the memory hole MH and on the gaps 48 by, for example, ALD. The tunneling insulating film 31 is, for example, a silicon oxide film.

The tunneling insulating film 31 is filled in the gap 48 and extends continuously in the stacking direction of the stacked body 100. A stepped portion is not formed on the side surface of the tunneling insulating film 31 exposed in the memory hole MH.

The semiconductor film 20 shown in FIG. 41A is formed on the side surface of the tunneling insulating film 31 by, for example, CVD. The semiconductor film 20 extends continuously in the stacking direction of the stacked body 100.

For example, the semiconductor film 20 is crystallized into polycrystalline silicon films by thermal annealing after being formed as amorphous silicon films.

The core film 50 shown in FIG. 41A is formed on the inner side of the semiconductor film 20. The core film 50 is, for example, a silicon oxide film.

Figure 41B:
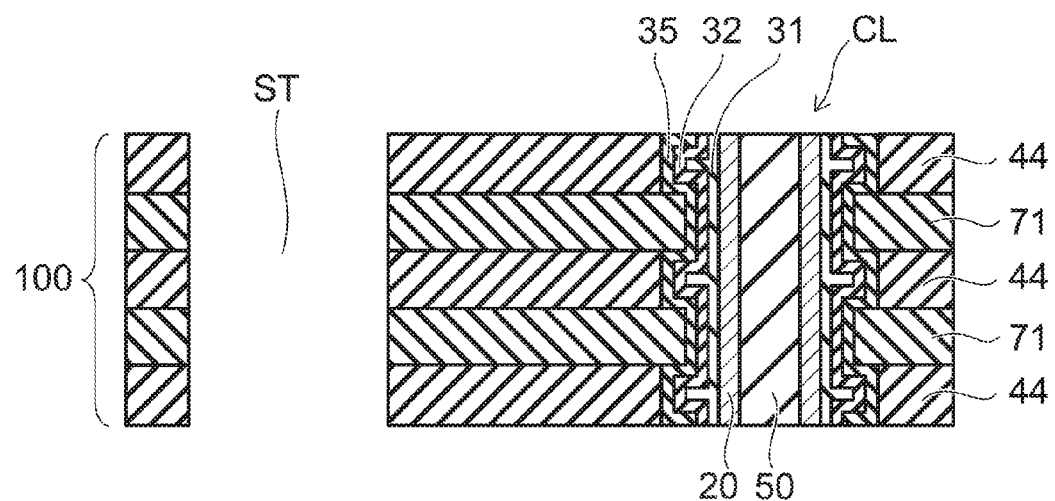

Then, the slit ST is made in the stacked body 100 as shown in FIG. 41B by RIE using not-shown mask including carbon layer, and CF based gas. The slit extends in the stacking direction of the stacked body 100 and pierces the stacked body 100. Further, the slit ST extends into the page surface and divides the stacked body 100 into a plurality of blocks.

Next, the first material layer 71 which is a silicon nitride layer is removed by an etchant containing, for example, a phosphoric acid supplied to the slit ST.

During the etching, the charge storage film 32 which is a silicon nitride film of the same kind as the first material layer 71 is covered with the second blocking film 35 which is a silicon oxide film, and is not etched.

Figure 42A:
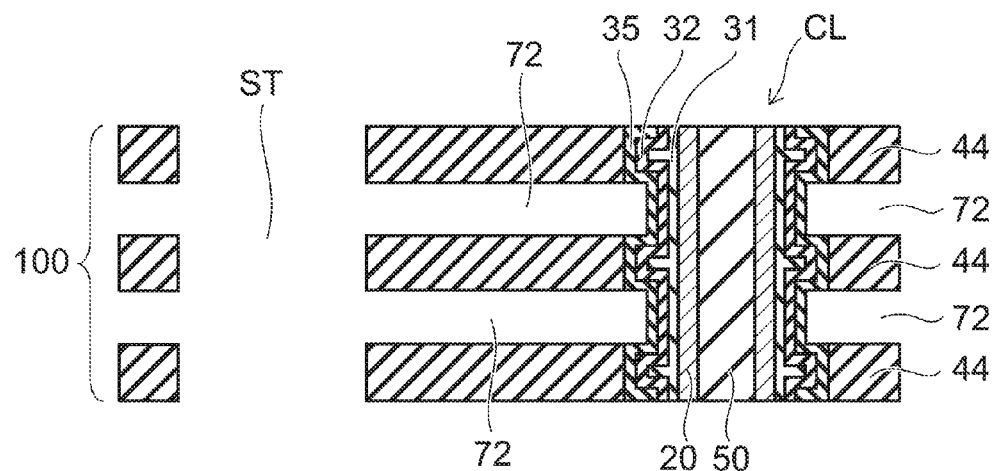

The first material layer 71 is removed, and a gap 72 that communicates with the slit ST is made between the second material layers 44 adjacent to each other above and below as shown in FIG. 42A.

The plurality of second material layers 44 that are stacked with the gap 72 interposed are supported by the columnar unit CL including the second blocking film 35, the charge storage film 32, the tunneling insulating film 31, the semiconductor film 20 and the core film 50.

The second material layer 44 and the second blocking film 35 are exposed in the gap 72.

Figure 42B:
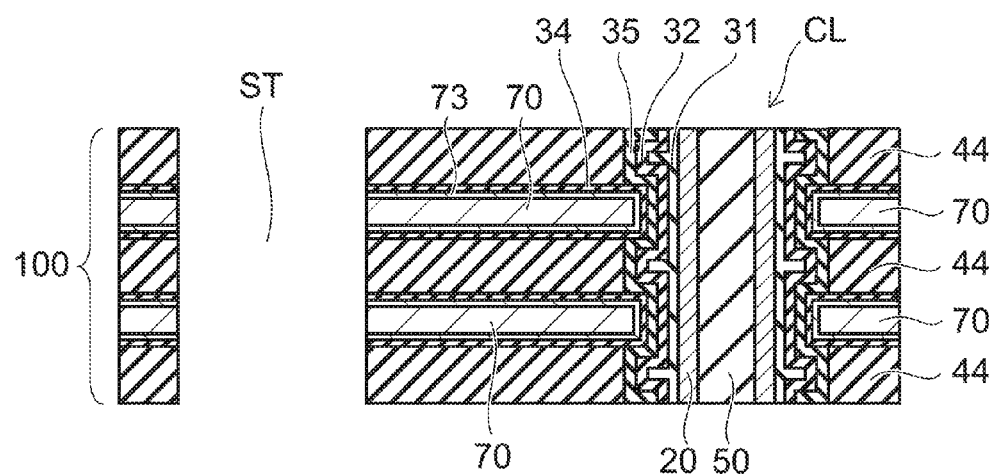

The first blocking film 34, a metal nitride film 73, and the electrode layer 70 shown in FIG. 42B are formed in this order in the gap 72.

The first blocking film 34 is a metal oxide film and may be, for example, an aluminum oxide film.

The first blocking film 34 is formed conformally along an upper surface, a lower surface, and a side surface exposed in the slit ST of the second material layer 44, and the second blocking film 35 by, for example, ALD.

The metal nitride film 73 is formed conformally along the first blocking film 34 on the inner side of the first blocking film 34 by, for example, ALD. The metal nitride film 73 is, for example, a titanium nitride film.

The electrode layer 70 is formed on the inner side of the metal nitride film 73 by, for example, CVD. The electrode layer 70 is grown in crystal using the metal nitride film 73 as a seed layer. The electrode layer 70 is, for example, a tungsten layer or a molybdenum layer.

The electrode layer 70, the metal nitride film 73, and the first blocking film 34 formed on the side surface of the slit ST are removed by, for example, wet-etching, RIE, or chemical dry etching (CDE).

The electrode layer 70, the metal nitride film 73, and the first blocking film 34 formed on the side surface of the slit ST is removed so that the side surface of the second material layer 44 is exposed in the slit ST.

Then, the second material layer 44 which is a BSG layer is removed by the etching through the slit ST.

Figure 43A:
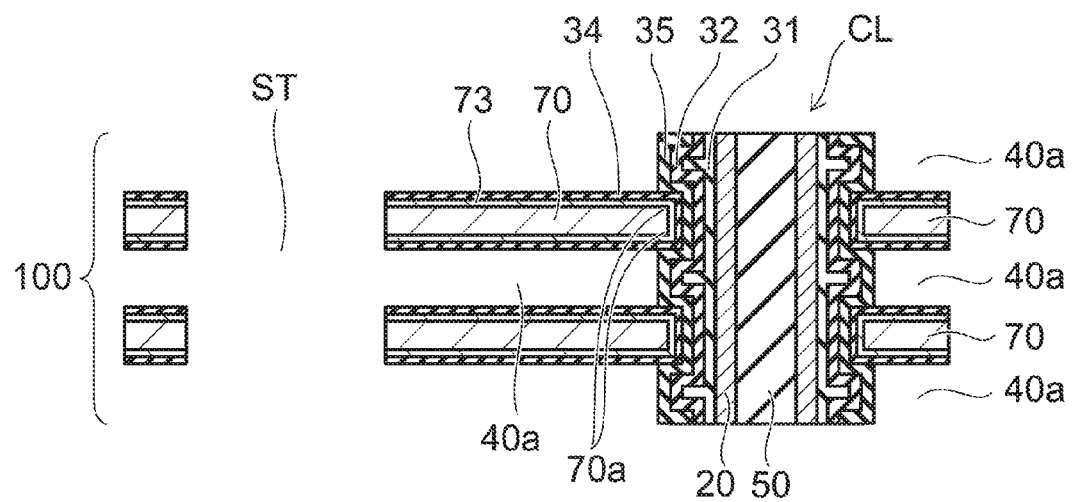

The second material layer 44 is removed, and a gap 40a that communicates with the slit ST is made between the electrode layers 70 adjacent to each other above and below as shown in FIG. 43A.

The plurality of the electrode layers 70 are supported by the columnar unit CL and the gap 40a between the electrode layers 70 is maintained. The second blocking film 35 is exposed in the gap 40a.

The second material layer 44 is removed by a process using an etchant containing, for example, hydrofluoric acid. The etchant containing hydrofluoric acid can be used in a vapor phase. In the embodiment, the second material layer 44 is removed by vapor phase cleaning (VPC) using a vapor containing hydrofluoric acid.

A ratio of an etching rate of the second material layer 44 which is a BSG layer with respect to an etching rate of the second blocking film 35 which is a silicon oxide film containing $SiO_2$ as a main component is 100 or more in VPC using vapor containing hydrofluoric acid.

Therefore, the second material layer 44 can be removed selectively while both of the second material layer 44 and the second blocking film 35 are silicon oxide based material.

Then, a portion of the second blocking film 35 exposed in the gap 40a is etched.

The second blocking film 35 is etched using an etchant including, for example, hydrofluoric acid in liquid phase. Otherwise the second blocking film 35 is etched by VPC using vapor having different hydrofluoric acid concentration from vapor used in the etching of the second material layer 44.

Figure 43B:
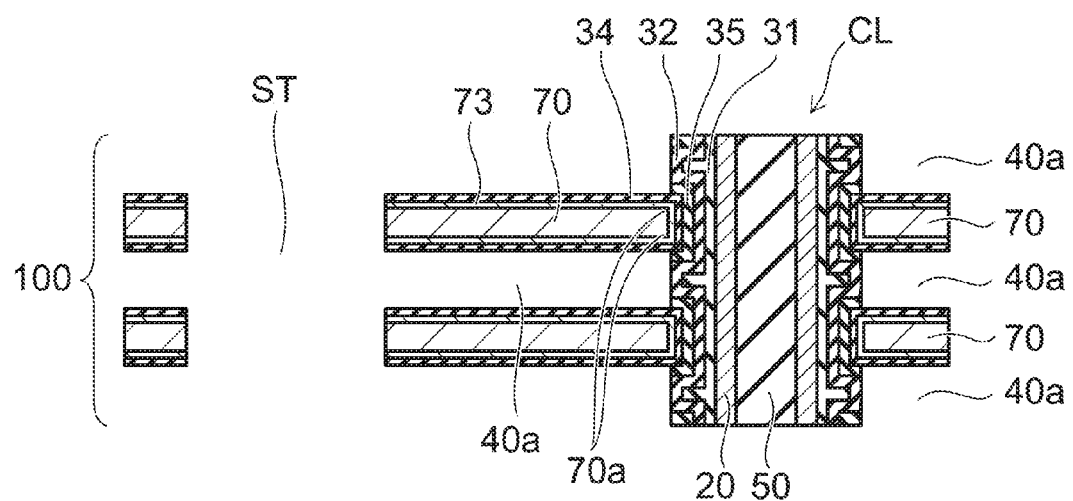

The portion of the second blocking film 35 exposed in the gap 40*a* is etched so that the charge storage film 32 is exposed in the gap 40*a* as shown in FIG. 43B. The second blocking film 35 is divided in the stacking direction (the vertical direction) of the stacked body 100.

Then, a portion of the charge storage film 32 exposed in the gap 40*a* is etched. The charge storage film 32 which is a silicon nitride film is etched using an etchant containing, for example, phosphoric acid.

Figure 44:
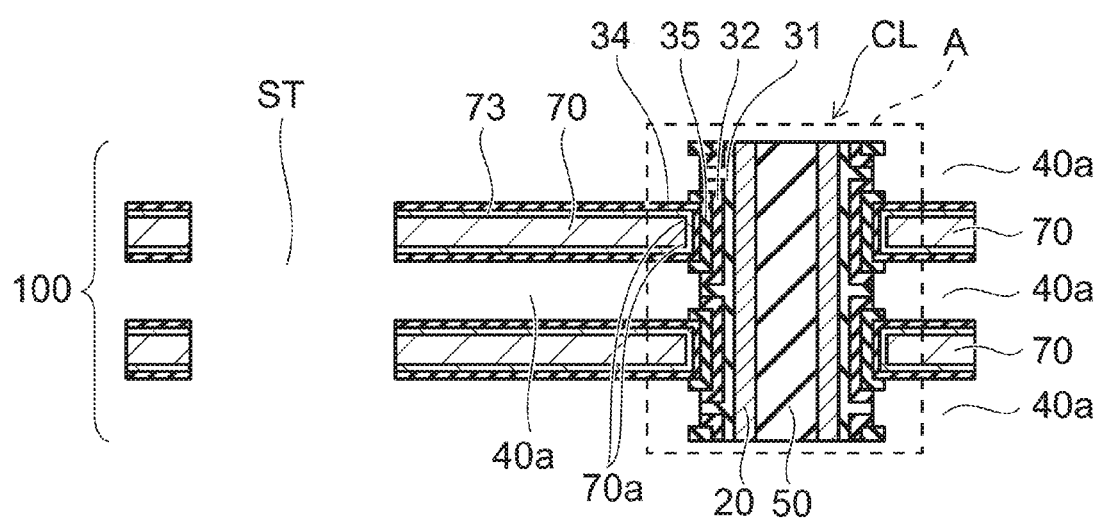

The portion of the charge storage film 32 exposed in the gap 40*a* is etched so that the tunneling insulating film 31 is exposed in the gap 40*a*, as shown in FIG. 44. The charge storage film 32 is divided in the stacking direction (the vertical direction) of the stacked body 100.

Figure 45:
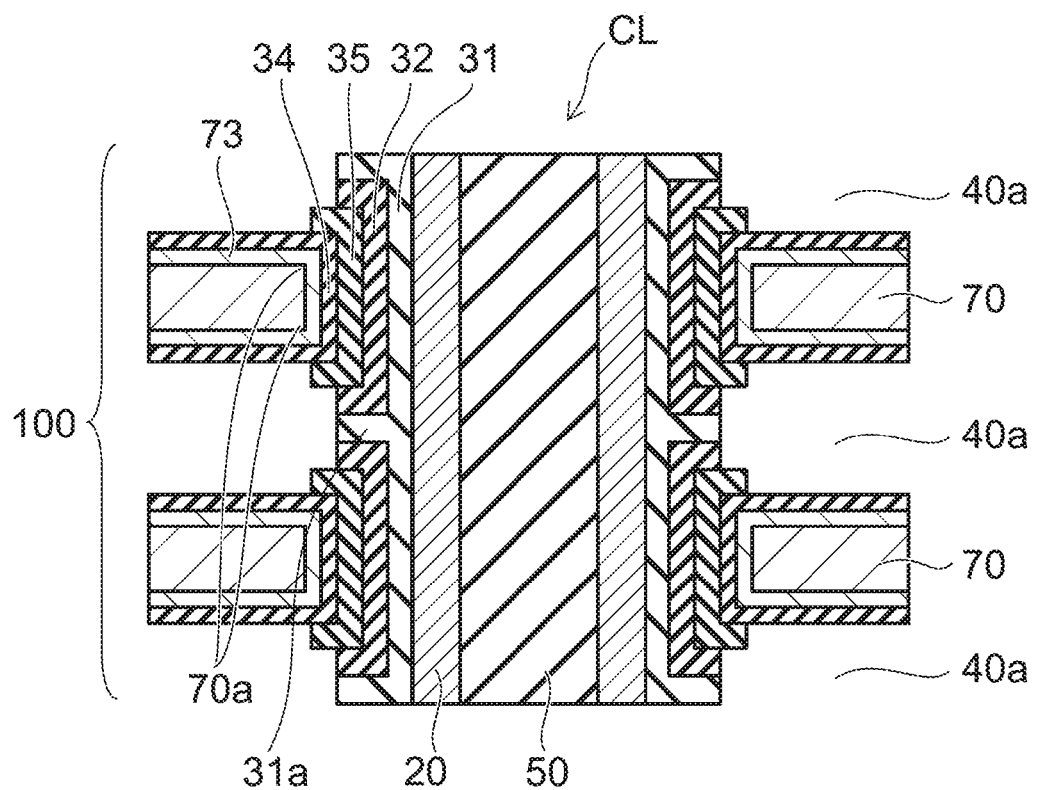

FIG. 45 is an enlarged view of a portion A shown in FIG. 44.

According to the embodiment, the gap 46 shown in FIG. 39B is made by receding the second material layer 44 after making the memory hole MH. Then, the second blocking film 35 and the charge storage film 32 are introduced into the gap 46.

Then, the etching process that divides the second blocking film 35 and the charge storage film 32 in the vertical direction, is controlled so as to stop during a portion introduced into the gap 46 is etched. Such a control enables to prevent that dispersion in disappearance rate among the second blocking film 35 and the charge storage film 32, for example, due to the difference of the distances from the slit ST results in the dispersion in etching amount in the vertical direction.

Accordingly, the second blocking film 35 and the charge storage film 32 can be remained surely between the electrode layer 70 and the semiconductor film 20. The lengths of the second blocking film 35 and the charge storage film 32 along the vertical direction remained after dividing is larger than the thickness of the electrode layer 70.

The second blocking film 35 covers a corner 70*a* on the columnar unit CL side of the electrode layer 70 with the metal nitride film 73 and the first blocking film 34 interposed between the second blocking film 35 and the electrode layer 70 in an example shown in FIG. 45. Further, the charge storage film 32 remains so as to cover a corner of the second blocking film 35. A portion 31*a* of the tunneling insulating film 31 is disposed between the charge storage films 32 divided in the vertical direction so as to protrude to the gap 40*a* side.

Then, the insulating film 63 is formed on a side surface and a bottom of the slit ST as shown in the FIG. 23. The insulating film 63 that has poor coverage plugs the opening of the gap 40*a* on the slit ST side. The interior of the gap 40*a* is not filled with the insulating film 63.

After removing the insulating film 63 formed on the bottom of the slit ST by RIE, the interconnect unit LI is filled into the slit ST as shown in FIG. 11. The lower end of the interconnect unit LI is connected to the substrate 10 via the semiconductor region 81.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    making a first through-portion in a stacked body, the first through-portion extending in a stacking direction, the stacked body including a first layer, a second layer, and a sacrificial layer provided between the first layer and the second layer;
    making a first gap while causing one portion of the sacrificial layer to remain between the first layer and the second layer by etching the sacrificial layer through the first through-portion, the first gap communicating with the first through-portion;
    forming a first film and causing a second gap to remain on an inner side of the first film, the first film being formed along a surface of the first layer adjacent to the first through-portion, along a surface of the first layer adjacent to the first gap, along a surface of the one portion of the sacrificial layer adjacent to the first gap, along a surface of the second layer adjacent to the first gap, and along a surface of the second layer adjacent to the first through-portion, the second gap communicating with the first through-portion;
    forming a second film in the second gap and on a side surface of the first film adjacent to the first through-portion;
    making a second through-portion in a region of the stacked body where the one portion of the sacrificial layer remains, the second through-portion extending in the stacking direction;
    exposing a first portion of the second film by etching the first film through the second through-portion, the first portion being formed in the second gap; and
    dividing the second film in the stacking direction by causing etching of at least a portion of the first portion of the second film to progress from an exposed portion of the first portion through the second through-portion.

2. The method for manufacturing the semiconductor device according to claim 1, wherein
    the second through-portion is formed to expose a side surface of the one portion of the sacrificial layer in the second through-portion; and
    the first film is exposed prior to the etching the first film by etching the one portion of the sacrificial layer from the second through-portion.

3. The method for manufacturing the semiconductor device according to claim 1, wherein
    the first film includes a first corner and a second corner in a state prior to the etching of the second film, a position of the first corner corresponding to a corner of the first layer, a position of the second corner corresponding to a corner of the second layer, the first portion of the second film being interposed between the first corner and the second corner in the stacking direction, and
    the first corner and the second corner of the first film remain after the etching of the second film.

4. The method for manufacturing the semiconductor device according to claim 3, wherein the first corner and the second corner of the first film are adjacent to a region between a plurality of portions of the second films separated in the stacking direction.

5. The method for manufacturing the semiconductor device according to claim 3, wherein the second film divided in the stacking direction covers the first corner and the second corner of the first film.

6. The method for manufacturing the semiconductor device according to claim 3, further comprising removing, by etching, the first corner and the second corner of the first film remaining after the etching of the second film.

* * * * *